(12) United States Patent
Nishimura

(10) Patent No.: US 10,396,065 B2
(45) Date of Patent: *Aug. 27, 2019

(54) SEMICONDUCTOR DEVICE HAVING A TEMPERATURE-DETECTING DIODE

(71) Applicant: FUJI ELECTRIC CO., LTD., Kawasaki-shi (JP)

(72) Inventor: Takeyoshi Nishimura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/228,249

(22) Filed: Aug. 4, 2016

(65) Prior Publication Data

US 2016/0343700 A1    Nov. 24, 2016

Related U.S. Application Data

(60) Division of application No. 14/485,554, filed on Sep. 12, 2014, now Pat. No. 9,461,030, which is a
(Continued)

(30) Foreign Application Priority Data

Aug. 9, 2012 (JP) .................................. 2012-177381

(51) Int. Cl.
*H01L 27/02* (2006.01)
*H01L 29/94* (2006.01)
(Continued)

(52) U.S. Cl.
CPC ...... *H01L 27/0255* (2013.01); *H01L 27/0629* (2013.01); *H01L 28/60* (2013.01);
(Continued)

(58) Field of Classification Search
CPC ............. H01L 27/0255; H01L 27/0629; H01L 29/66348; H01L 29/66666; H01L 29/7395;
(Continued)

(56) References Cited

U.S. PATENT DOCUMENTS 5,100,829 A * 3/1992 Fay ..................... H01L 27/0248
257/337
5,642,252 A     6/1997 Sakamoto et al.
(Continued)

FOREIGN PATENT DOCUMENTS

JP      4-056163 A      2/1992
JP      6-045620 A      2/1994
(Continued)

OTHER PUBLICATIONS

Japanese Office Action with translation dated May 12, 2015.

*Primary Examiner* — Khiem D Nguyen
(74) *Attorney, Agent, or Firm* — Rabin & Berdo, P.C.

(57) ABSTRACT

A capacitive component region is formed below a temperature detecting diode or below a protective diode. In addition, the capacitive component region is formed below an anode metal wiring line connecting the temperature detecting diode and an anode electrode pad and below a cathode metal wiring line connecting the temperature detecting diode and a cathode electrode pad. The capacitive component region is an insulating film interposed between polysilicon layers. Specifically, a first insulating film, a polysilicon conductive layer, and a second insulating film are sequentially formed on a first main surface of a semiconductor substrate, and the temperature detecting diode, the protective diode, the anode metal wiring line, or the cathode metal wiring line is formed on the upper surface of the second insulating film. Therefore,
(Continued)

it is possible to improve the static electricity resistance of the temperature detecting diode or the protective diode.

8 Claims, 21 Drawing Sheets

Related U.S. Application Data continuation of application No. PCT/JP2013/067575, filed on Jun. 26, 2013.

(51) Int. Cl.
```
H01L 49/02      (2006.01)
H01L 27/06      (2006.01)
H01L 29/866     (2006.01)
H01L 29/66      (2006.01)
H01L 29/78      (2006.01)
H01L 29/06      (2006.01)
H01L 29/739     (2006.01)
```
(52) U.S. Cl.
CPC .... *H01L 29/0696* (2013.01); *H01L 29/66348* (2013.01); *H01L 29/66666* (2013.01); *H01L 29/66734* (2013.01); *H01L 29/7395* (2013.01); *H01L 29/7803* (2013.01); *H01L 29/7804* (2013.01); *H01L 29/7808* (2013.01); *H01L 29/7811* (2013.01); *H01L 29/7813* (2013.01); *H01L 29/7827* (2013.01); *H01L 29/866* (2013.01); *H01L 29/94* (2013.01)

(58) Field of Classification Search
CPC ... H01L 29/866; H01L 29/94; H01L 29/7813; H01L 29/7804; H01L 29/66734; H01L 29/7811; H01L 29/7808; H01L 29/7827
See application file for complete search history.

(56) References Cited

U.S. PATENT DOCUMENTS

| | | | | |
|---|---|---|---|---|
| 5,915,179 A * | 6/1999 | Etou | ............... | H01L 27/0629 257/484 |
| 6,229,180 B1 | 5/2001 | Yoshida et al. | | |
| 6,242,787 B1 * | 6/2001 | Nakayama | ......... | H01L 21/8249 257/335 |
| 6,323,518 B1 * | 11/2001 | Sakamoto | ............. | H01L 23/62 257/330 |
| 6,614,633 B1 | 9/2003 | Kohno | | |
| 7,462,922 B2 * | 12/2008 | Mori | ..................... | H01L 23/34 257/146 |
| 7,679,143 B2 * | 3/2010 | Suzuki | ............... | H01L 27/0629 257/355 |
| 7,893,458 B2 | 2/2011 | Takahashi et al. | | |
| 7,943,439 B2 * | 5/2011 | Yoshikawa | ........ | H01L 27/0248 257/E21.499 |
| 8,183,606 B2 * | 5/2012 | Arai | ................... | H01L 27/0255 257/262 |
| 9,548,294 B2 * | 1/2017 | Nishimura | ......... | H01L 27/0255 |
| 2001/0010379 A1 * | 8/2001 | Yoshida | .............. | H01L 25/071 257/355 |
| 2002/0135037 A1 | 9/2002 | Tomomatsu | | |
| 2004/0095699 A1 | 5/2004 | Kohno | | |
| 2005/0082542 A1 * | 4/2005 | Sumakeris | ............. | C30B 29/36 257/77 |
| 2005/0156267 A1 | 7/2005 | Mori et al. | | |
| 2007/0285856 A1 | 12/2007 | Ozoe | | |
| 2008/0054325 A1 | 3/2008 | Takahashi et al. | | |
| 2008/0203389 A1 | 8/2008 | Ozoe et al. | | |
| 2009/0039432 A1 * | 2/2009 | Nishimura | ......... | H01L 27/0255 257/362 |
| 2011/0062545 A1 * | 3/2011 | Nakajima | ........... | H01L 27/0255 257/470 |
| 2011/0241170 A1 * | 10/2011 | Haeberlen | ....... | H01L 21/823475 257/532 |

FOREIGN PATENT DOCUMENTS

| | | |
|---|---|---|
| JP | 7-058293 A | 3/1995 |
| JP | 07-153920 A | 6/1995 |
| JP | 7-202224 A | 8/1995 |
| JP | 63-299264 A | 6/1998 |
| JP | 11-284175 A | 10/1999 |
| JP | 2002-280556 A | 9/2002 |
| JP | 3413569 B2 | 4/2003 |
| JP | 2005-026279 A | 1/2005 |
| JP | 2007-335474 A | 12/2007 |
| JP | 2008-060468 A | 3/2008 |
| JP | 2009-043953 A | 2/2009 |
| JP | 4329829 B2 | 9/2009 |
| JP | 2010-129707 A | 6/2010 |
| JP | 4501178 B2 | 7/2010 |
| JP | 2011-009630 A | 1/2011 |
| JP | 4765252 B2 | 9/2011 |

* cited by examiner (A) PLAN VIEW (B) EQUIVALENT CIRCUIT DIAGRAM (A) CROSS-SECTIONAL VIEW TAKEN ALONG LINE C-C'

(B) EQUIVALENT CIRCUIT DIAGRAM (A) CROSS-SECTIONAL VIEW TAKEN ALONG LINE D-D'

(B) EQUIVALENT CIRCUIT DIAGRAM (A) CROSS-SECTIONAL VIEW TAKEN ALONG LINE C-C'

(B) EQUIVALENT CIRCUIT DIAGRAM (A) CROSS-SECTIONAL VIEW TAKEN ALONG LINE C-C'

(B) EQUIVALENT CIRCUIT DIAGRAM (A) CROSS-SECTIONAL VIEW TAKEN ALONG LINE D-D'

(B) EQUIVALENT CIRCUIT DIAGRAM

SEMICONDUCTOR DEVICE HAVING A TEMPERATURE-DETECTING DIODE

This application is a divisional of U.S. application Ser. No. 14/485,554 filed on Sep. 12, 2014, issued as U.S. Pat. No. 9,461,030, which was a continuation under 35 U.S.C. 120 of International Application PCT/JP2013/067575 having the International Filing Date of Jun. 26, 2013, and having the benefit of the earlier filing date of Japanese Application No. 2012-177381, filed on Aug. 9, 2012. All of the identified applications are fully incorporated herein by reference.

TECHNICAL FIELD

The invention relates to a semiconductor device including a MOS semiconductor element and a temperature detecting diode or a protective diode and a method for producing the same.

BACKGROUND ART

In the related art, a semiconductor device has been known which includes a diode as an overheat protection function in order to prevent the thermal breakdown of a MOS (metal-oxide film-semiconductor insulated gate) semiconductor element, such as a metal oxide semiconductor field effect transistor (MOSFET) or an insulated gate bipolar transistor (IGBT). Specifically, in order to protect the MOS semiconductor element from overvoltage, a plurality of diodes or bidirectional diodes are provided between the gate and the source or between the gate and the drain.

As the MOS semiconductor device according to the related art which includes the temperature detecting diode, a device has been proposed in which a capacitor is formed so as to overlap a temperature detecting diode in the thickness direction of a semiconductor substrate and is electrically connected in parallel to the temperature detecting diode, in order to reduce radio frequency noise acting on the temperature detecting diode (for example, see the following Patent Document 1).

Another MOS semiconductor device has been proposed in which a protective capacitor or a diode and a temperature detecting diode are formed on the same substrate and the protective capacitor or the diode is connected in parallel to the temperature detecting diode, in order to improve the static electricity resistance of the temperature detecting diode (for example, see the following Patent Document 2 and Patent Document 3).

Another MOS semiconductor device has been proposed which includes a capacitor for preventing a change in characteristics or damage when a voltage that is higher than the breakdown voltage of a protective diode for a temperature detecting diode is applied to the protective diode in the reverse direction due to, for example, electrostatic discharge (for example, see the following Patent Document 4).

Another MOS semiconductor device has been proposed in which, in order to prevent the arrangement position of a temperature detecting diode from being limited by a diffusion structure in a portion below the temperature detecting diode (a portion which is closer to a semiconductor substrate than the temperature detecting diode), an insulating film is formed on the semiconductor substrate, a conductive layer is formed on the insulating film, the temperature detecting diode is formed on the conductive layer, with an insulating film interposed therebetween, and the temperature detecting diode is electrically insulated from the semiconductor substrate (for example, see the following Patent Document 5).

As another MOS semiconductor device, a device has been proposed in which two polysilicon diodes having an insulating film interposed therebetween are formed on an insulating film formed on the main surface of a semiconductor substrate main surface and the insulating film between the polysilicon diodes is used as a capacitive component region (for example, see the following Patent Document 6). In the following Patent Document 6, the insulating film serving as a capacitor has an opening portion and the polysilicon diode on the insulating film and the polysilicon diode below the insulating film are connected to each other through the opening portion. As such, since the two-layer polysilicon diodes are formed, the area of the polysilicon diode is reduced and the capacitor is electrically insulated from the semiconductor substrate. Therefore, stable capacitance is obtained.

As another MOS semiconductor device, a device has been proposed in which a plurality of stripe-shaped or rectangular zener diodes are formed in a gate pad and are electrically connected in parallel to each other, thereby improving static electricity resistance (for example, see the following Patent Document 7). In addition, as a method for producing a MOS semiconductor device, a production method has been proposed in which, in order to reduce the number of steps when a polysilicon diode, a capacitor, a resistor, and an insulated gate semiconductor element are formed on the same semiconductor substrate, a gate oxide film and an oxide film thicker than the gate oxide film are formed, a polysilicon layer is formed thereon and is then patterned to form a gate electrode, the diode, the capacitor, and the resistor (for example, see the following Patent Document 8).

As another method for producing a MOS semiconductor device, a method has been proposed in which an insulating film between a temperature detecting diode and a semiconductor substrate and a gate oxide film are formed in the same step (for example, see the following Patent Document 9).

CITATION LIST

Patent Document

Patent Document 1: JP 4329829 B1
Patent Document 2: JP 7-202224 A
Patent Document 3: JP 4765252 B1
Patent Document 4: JP 2007-335474 A
Patent Document 5: JP 2005-26279 A
Patent Document 6: JP 6-45620 A
Patent Document 7: JP 2009-43953 A
Patent Document 8: JP 3413569 B1
Patent Document 9: JP 2010-129707 A In the MOS semiconductor device according to the related art, as illustrated in FIG. 20, a temperature detecting diode 1 is arranged in the vicinity of a central portion in which the temperature of the MOS semiconductor device is at the highest. FIG. 20 is a plan view illustrating the structure of the MOS semiconductor device according to the related art. FIG. 21 is a cross-sectional view illustrating the cross-sectional structure taken along the cutting line A-A' of FIG. 20. As illustrated in FIG. 21, the temperature detecting diode 1, an anode electrode pad 3 and a cathode electrode pad 4 are formed on an insulating film 19 that is thicker than a gate insulating film 32. An anode metal wiring line 6 that connects the temperature detecting diode 1 and the anode electrode pad 3 or a cathode metal wiring line 7 that connects the temperature detecting diode 1 and the cathode electrode pad 4 is also formed on the insulating film 19. The structure portion of the MOS semiconductor device is formed on the insulating film 19 in order to prevent the breakdown of the temperature detecting diode 1 or protective diodes 21 and 22 due to static electricity or overvoltage applied to a gate electrode pad 5, a source electrode 34, an anode electrode, or a cathode electrode.

However, the temperature detecting diode 1 or the protective diodes 21 and 22 have low static electricity resistance. For example, a method of connecting a resistor with high resistance which forms a protective diode for the temperature detecting diode 1 has been used in order to improve the static electricity resistance of the temperature detecting diode 1. However, when a large diode is formed in order to protect the temperature detecting diode 1, a leakage current increases, on-resistance (on-voltage) increases due to an increase in invalid area, or an element area (the area of an active region 8) increases, which results in an increase in costs.

The protective diode 21 which is formed between the gate electrode 33 and the source electrode 34 of the MOS semiconductor element or the protective diode 22 which is formed between the gate electrode 33 and the drain electrode 35 of the MOS semiconductor element are formed along the gate electrode pad 5. Therefore, the pn junction area of the protective diodes 21 and 22 needs to increase in order to increase the capacitance of the protective diode 21 and 22, which results in an increase in the area of the protective diodes 21 and 22. Therefore, the area of the active region 8 is reduced and on-resistance increases.

The invention has been made in order to solve the above-mentioned problems of the related art and an object of the invention is to provide a semiconductor device capable of improving the static electricity resistance of a temperature detecting diode or a protective diode and a method for producing the same.

SUMMARY

In order to solve the above-mentioned problems and achieve the object of the invention, a semiconductor device according to an aspect of the invention includes a semiconductor element that makes a current flow in a thickness direction of a semiconductor substrate and a diode that is connected to the semiconductor element. The semiconductor device has the following characteristics. A first insulating film is formed on a first main surface of the semiconductor substrate. A conductive layer is formed on the first insulating film. A second insulating film is formed on the conductive layer. The diode including a first-conductivity-type layer and a second-conductivity-type layer formed on the second insulating film is formed. A first capacitor that has the second insulating film between the first-conductivity-type layer and the conductive layer as a first capacitive component region is formed. A second capacitor that has the second insulating film between the second-conductivity-type layer and the conductive layer as a second capacitive component region is formed. The conductive layer is electrically insulated.

The semiconductor device according to the above-mentioned aspect of the invention may further have the following characteristics. The semiconductor element further may have the following structure. A first semiconductor layer of a first conductivity type is formed in a surface layer of the first main surface of the semiconductor substrate. A first semiconductor region of a second conductivity type is selectively formed in a surface layer of the first semiconductor layer which is close to the first main surface. A second semiconductor region of the first conductivity type is selectively formed in a surface layer of the first semiconductor region which is close to the first main surface. A gate electrode is formed on a surface of the first semiconductor region, with a gate insulating film interposed therebetween, in a portion which is interposed between the first semiconductor layer and the second semiconductor region.

The semiconductor device according to the above-mentioned aspect of the invention may further include a third capacitor that has the first insulating film between the conductive layer and the semiconductor substrate as a third capacitive component region.

The semiconductor device according to the above-mentioned aspect of the invention may further have the following characteristics. The conductive layer is divided into a first conductive layer portion that faces the first-conductivity-type layer, with the second insulating film interposed therebetween, and a second conductive layer portion that faces the second-conductivity-type layer, with the second insulating film interposed therebetween. A space between the first conductive layer portion and the second conductive layer portion is filled with the second insulating film. A third capacitor that has the second insulating film provided between the first conductive layer portion and the second conductive layer portion as a third capacitive component region is formed.

The semiconductor device according to the above-mentioned aspect of the invention may further have the following characteristics. A fourth capacitor that has the first insulating film between the first conductive layer portion and the semiconductor substrate as a fourth capacitive component region is formed. A fifth capacitor that has the first insulating film between the second conductive layer portion and the semiconductor substrate as a fifth capacitive component region is formed.

In order to solve the above-mentioned problems and achieve the object of the invention, a semiconductor device according to another aspect of the invention includes a semiconductor element that makes a current flow in a thickness direction of a semiconductor substrate and a temperature detecting diode that detects a temperature of the semiconductor element. The semiconductor device has the following characteristics. The temperature detecting diode is provided in an active region of the semiconductor element. An anode metal wiring line that is connected to an anode of the temperature detecting diode is provided on a first main surface side of the semiconductor substrate. A cathode metal wiring line that is connected to a cathode of the temperature detecting diode is provided on the first main surface side of the semiconductor substrate. A first insulating film is formed on a first main surface of the semiconductor substrate between the anode and cathode metal wiring lines and the semiconductor substrate. A conductive layer is formed on the first insulating film. A second insulating film is formed on the conductive layer. A first semiconductor layer that is connected to the anode metal wiring line is formed between the second insulating film and the anode metal wiring line. A second semiconductor layer that is connected to the cathode metal wiring line is formed between the second insulating film and the cathode metal wiring line. A first capacitor that has the second insulating film between the first semiconductor layer and the conductive layer as a first capacitive component region is formed. A second capacitor that has the second insulating film between the second semiconductor layer and the conductive layer as a second capacitive component region is formed. The conductive layer is electrically insulated.

The semiconductor device according to the above-mentioned aspect of the invention may further have the following characteristics. The semiconductor element may have the following structure. A first semiconductor layer of a first conductivity type is formed in a surface layer of the first main surface of the semiconductor substrate. A first semiconductor region of a second conductivity type is selectively formed in a surface layer of the first semiconductor layer which is close to the first main surface. A second semiconductor region of the first conductivity type is selectively formed in a surface layer of the first semiconductor region which is close to the first main surface. A gate electrode is formed on a surface of the first semiconductor region, with a gate insulating film interposed therebetween, in a portion which is interposed between the first semiconductor layer and the second semiconductor region.

The semiconductor device according to the above-mentioned aspect of the invention may further include a third capacitor that has the first insulating film between the conductive layer and the semiconductor substrate as a third capacitive component region.

The semiconductor device according to the above-mentioned aspect of the invention may further have the following structure. The conductive layer is divided into a first conductive layer portion that faces the first semiconductor layer, with the second insulating film interposed therebetween, and a second conductive layer portion that faces the second semiconductor layer, with the second insulating film interposed therebetween. A space between the first conductive layer portion and the second conductive layer portion is filled with the second insulating film. A third capacitor that has the second insulating film provided between the first conductive layer portion and the second conductive layer portion as a third capacitive component region is formed.

The semiconductor device according to the above-mentioned aspect of the invention may further have the following structure. A fourth capacitor that has the first insulating film between the first conductive layer portion and the semiconductor substrate as a fourth capacitive component region is formed. A fifth capacitor that has the first insulating film between the second conductive layer portion and the semiconductor substrate as a fifth capacitive component region is formed.

In the semiconductor device according to the above-mentioned aspect of the invention, the diode may be a temperature detecting diode that is provided in an active region of the semiconductor element and detects a temperature of the semiconductor element.

The semiconductor device according to the above-mentioned aspect of the invention may further include a gate electrode pad that is connected to the gate electrode and a source electrode that is connected to the first semiconductor region and the second semiconductor region. The diode may be a protective diode that is formed between the gate electrode pad and the source electrode.

The semiconductor device according to the above-mentioned aspect of the invention may further include a gate electrode pad that is connected to the gate electrode, a third semiconductor region of the first conductivity type that is selectively formed in the surface layer of the first semiconductor layer which is close to the first main surface, and a drain electrode that is connected to the third semiconductor region. The diode may be a protective diode that is formed between the gate electrode pad and the drain electrode.

In order to solve the above-mentioned problems and achieve the object of the invention, a method for producing the semiconductor device according to the above-mentioned aspect of the invention has the following characteristics. First, a step of forming the gate insulating film and the first insulating film on the first semiconductor region is performed. Then, a step of forming the gate electrode which is made of polysilicon on the gate insulating film and forming the conductive layer which is made of polysilicon on the first insulating film is performed. Then, a step of patterning the gate electrode and the conductive layer is performed. Then, a step of forming the second insulating film on the patterned conductive layer is performed. Then, a step of forming a second semiconductor layer which is made of polysilicon on the second insulating film is performed. Then, a step of implanting first-conductivity-type impurity ions to selectively form the first-conductivity-type layer of the diode in the second semiconductor layer and forming the second semiconductor region, which will be a source region of the semiconductor element, in the surface layer of the first semiconductor region close to the first main surface is performed.

In order to solve the above-mentioned problems and achieve the object of the invention, a method for producing the semiconductor device according to the above-mentioned aspect of the invention has the following characteristics. First, a step of forming the gate insulating film and the first insulating film on the first semiconductor region is performed. Then, a step of forming the gate electrode which is made of polysilicon on the gate insulating film and forming the conductive layer which is made of polysilicon on the first insulating film is performed. Then, a step of patterning the gate electrode and the conductive layer is performed. Then, a step of forming the second insulating film on the patterned conductive layer is performed. Then, a step of forming the first semiconductor layer which is made of polysilicon on the second insulating film so as to be close to the anode metal wiring line and forming the second semiconductor layer which is made of polysilicon on the second insulating film so as to be close to the cathode metal wiring line is performed.

In order to solve the above-mentioned problems and achieve the object of the invention, a semiconductor device according to another aspect of the invention includes an insulated gate semiconductor element that makes a current flow in a thickness direction of a semiconductor substrate and a diode that is connected to the insulated gate semiconductor element. The semiconductor device has the following characteristics. A first insulating film having a thickness that is equal to or greater than a thickness of a gate insulating film of the insulated gate semiconductor element and equal to or less than 1000 Å is formed on a first main surface of the semiconductor substrate. The diode including a first-conductivity-type layer and a second-conductivity-type layer that are formed on the first insulating film is arranged. A first capacitor that has the first insulating film between the first-conductivity-type layer and the semiconductor substrate as a first capacitive component region is formed. A second capacitor that has the first insulating film between the second-conductivity-type layer and the semiconductor substrate as a second capacitive component region is formed.

The semiconductor device according to the above-mentioned aspect of the invention may further have the following characteristics. The insulated gate semiconductor element may have the following structure. A first semiconductor layer of a first conductivity type is formed in a surface layer of the first main surface of the semiconductor substrate. A first semiconductor region of a second conductivity type is selectively formed in a surface layer of the first semiconductor layer which is close to the first main surface. A second semiconductor region of the first conductivity type is selectively formed in a surface layer of the first semiconductor region. A gate electrode is formed on a surface of the first semiconductor region, with the gate insulating film interposed therebetween, in a portion which is interposed between the first semiconductor layer and the second semiconductor region.

In order to solve the above-mentioned problems and achieve the object of the invention, a semiconductor device according to another aspect of the invention includes an insulated gate semiconductor element that makes a current flow in a thickness direction of a semiconductor substrate and a temperature detecting diode that detects a temperature of the insulated gate semiconductor element. The semiconductor device has the following characteristics. The temperature detecting diode is provided in an active region of the insulated gate semiconductor element. An anode metal wiring line that is connected to an anode of the temperature detecting diode is provided on a first main surface side of the semiconductor substrate. A cathode metal wiring line that is connected to a cathode of the temperature detecting diode is provided on the first main surface side of the semiconductor substrate. A first insulating film having a thickness that is equal to or greater than a thickness of a gate insulating film of the insulated gate semiconductor element and equal to or less than 1000 Å is formed on a first main surface of the semiconductor substrate between the anode and cathode metal wiring lines and the semiconductor substrate. A first semiconductor layer that is connected to the anode metal wiring line is formed between the first insulating film and the anode metal wiring line. A second semiconductor layer that is connected to the cathode metal wiring line is formed between the first insulating film and the cathode metal wiring line. A first capacitor that has the first insulating film between the first semiconductor layer and the semiconductor substrate as a first capacitive component region is formed. A second capacitor that has the first insulating film between the second semiconductor layer and the semiconductor substrate as a second capacitive component region is formed.

The semiconductor device according to the above-mentioned aspect of the invention may further have the following characteristics. The insulated gate semiconductor element may have the following structure. A first semiconductor layer of a first conductivity type is formed in a surface layer of the first main surface of the semiconductor substrate. A first semiconductor region of a second conductivity type is selectively formed in a surface layer of the first semiconductor layer which is close to the first main surface. A second semiconductor region of the first conductivity type is selectively formed in a surface layer of the first semiconductor region which is close to the first main surface. A gate electrode is formed on a surface of the first semiconductor region, with the gate insulating film interposed therebetween, in a portion which is interposed between the first semiconductor layer and the second semiconductor region.

In the semiconductor device according to the above-mentioned aspect of the invention, the diode may be a temperature detecting diode that is provided in an active region of the insulated gate semiconductor element and detects a temperature of the insulated gate semiconductor element.

The semiconductor device according to the above-mentioned aspect of the invention may further include a gate electrode pad that is connected to the gate electrode and a source electrode that is connected to the first semiconductor region and the second semiconductor region. The diode may be a protective diode that is formed between the gate electrode pad and the source electrode.

The semiconductor device according to the above-mentioned aspect of the invention may further include a gate electrode pad that is connected to the gate electrode, a third semiconductor region of the first conductivity type that is selectively formed in the surface layer of the first semiconductor layer which is close to the first main surface, and a drain electrode that is connected to the third semiconductor region. The diode may be a protective diode that is formed between the gate electrode pad and the drain electrode.

In the semiconductor device according to the above-mentioned aspect of the invention, the temperature detecting diode may be made of polysilicon. In addition, in the semiconductor device according to the above-mentioned aspect of the invention, the protective diode may be made of polysilicon.

In the semiconductor device according to the above-mentioned aspect of the invention, the conductive layer may be made of polysilicon.

In the semiconductor device according to the above-mentioned aspect of the invention, the temperature detecting diode may be a zener diode. In addition, in the semiconductor device according to the above-mentioned aspect of the invention, the protective diode may be a zener diode.

In the semiconductor device according to the above-mentioned aspect of the invention, the semiconductor element may be a trench-type insulated gate semiconductor element. In addition, in the semiconductor device according to the above-mentioned aspect of the invention, the insulated gate semiconductor element may be a trench-type insulated gate semiconductor element.

According to the semiconductor device and the semiconductor device production method of the invention, the capacitive component region is formed below the temperature detecting diode, below the anode metal wiring line connected to the anode electrode of the temperature detecting diode, or below the cathode metal wiring line connected to the cathode electrode of the temperature detecting diode. Therefore, it is possible to improve the static electricity resistance of the temperature detecting diode. In addition, according to the semiconductor device and the semiconductor device production method of the invention, the capacitive component region is formed below the protective diode. Therefore, it is possible to improve the static electricity resistance of the protective diode.

DETAILED DESCRIPTION

Figure 1:
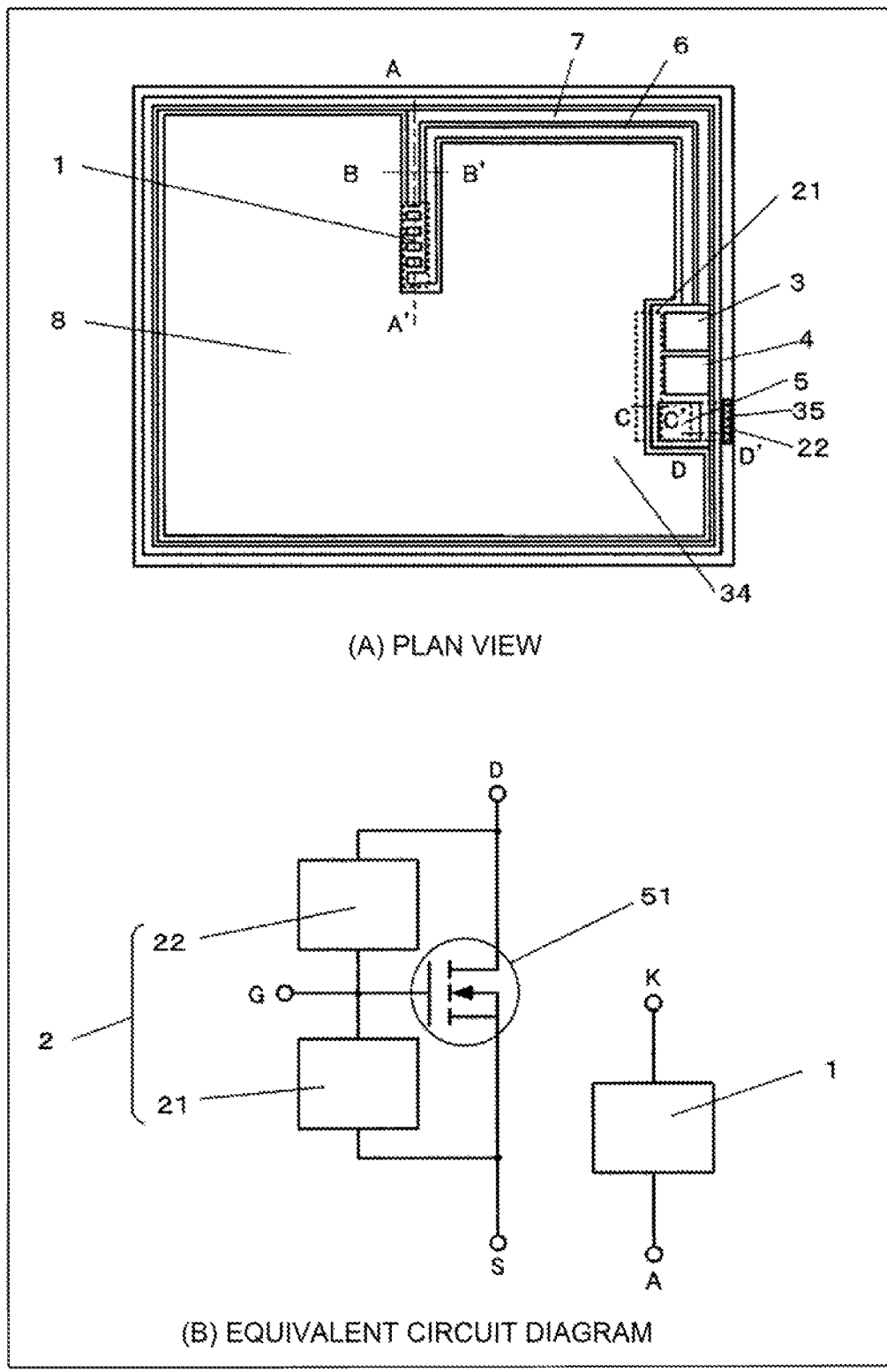
FIG. 1 is a diagram illustrating the structure of a semiconductor device according to Embodiment 1 of the invention.

Hereinafter, various non-limiting embodiments of a semiconductor device and a method for producing the same according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiment and the accompanying drawings, the same components are denoted by the same reference numerals and the description thereof will not be repeated.

In each of the following embodiments, a MOSFET (insulated gate field effect transistor) is used as a MOS semiconductor element. However, the MOS semiconductor element is not limited to the MOSFET. For example, an insulated gate bipolar transistor (IGBT) can be used as the MOS semiconductor element.

A temperature detecting diode and a protective diode described in the claims indicate a temperature detecting diode 1 and a protective diode 2, respectively.

Embodiment 1

A semiconductor device according to Embodiment 1 of the invention will be described. FIG. 1 is a diagram illustrating the structure of the semiconductor device according to Embodiment 1 of the invention. FIG. 1(A) is a plan view illustrating the structure of the semiconductor device according to Embodiment 1 of the invention and FIG. 1(B) is an equivalent circuit diagram illustrating protective diodes 21 and 22 illustrated in FIG. 1(a).

As illustrated in FIGS. 1(a) and 1(b), the semiconductor device according to Embodiment 1 includes a MOSFET 51, a temperature detecting diode 1, and the protective diodes 21 and 22 (protective diode 2). The temperature detecting diode 1 has a function of detecting the temperature of the MOSFET 51. The protective diode 21 is connected between a gate G and a source S of the MOSFET 51 and has a function of preventing dielectric breakdown due to, for example, static electricity or surge (transient overvoltage). The protective diode 22 is connected between the gate G and a drain D of the MOSFET 51 and has a function of preventing the breakdown of the element due to, for example, static electricity or surge.

The temperature detecting diode 1 is formed in the vicinity of a central portion of an active region 8 of the MOSFET 51 in which the temperature is at the highest. A source electrode 34 (source S) of the MOSFET 51 is arranged so as to cover a portion of the active region 8 other than the temperature detecting diode 1, an anode metal wiring line 6, and a cathode metal wiring line 7. An anode electrode pad 3 that is connected to an anode A of the temperature detecting diode 1, a cathode electrode pad 4 that is connected to a cathode K of the temperature detecting diode 1, and a gate electrode pad 5 that is connected to the gate G of the MOSFET 51 are formed in an outer circumferential portion of the active region 8. The anode electrode pad 3, the cathode electrode pad 4, and the gate electrode pad 5 are arranged along, for example, the outer circumference of the active region 8. A drain electrode 35 (drain D) of the MOSFET 51 is arranged closer to the outer circumference of the semiconductor device than the gate electrode pad 5.

The temperature detecting diode 1 is arranged so as to be separated from the anode electrode pad 3 and the cathode electrode pad 4. The anode A (FIG. 1(B)) of the temperature detecting diode 1 and the anode electrode pad 3 are connected to each other by the anode metal wiring line 6. The cathode K of the temperature detecting diode 1 and the cathode electrode pad 4 are connected to each other by the cathode metal wiring line 7. The anode metal wiring line 6 and the cathode metal wiring line 7 extend from the temperature detecting diode 1 to the anode electrode pad 3 and the cathode electrode pad 4 along, for example, the outer circumference of the active region 8, respectively. The protective diode 21 is formed on the side of the gate electrode pad 5 close to the inside of the semiconductor device (the central portion side of the active region 8) along the gate electrode pad 5, the anode electrode pad 3, and the cathode electrode pad 4 and is connected to the gate electrode pad 5 and the source electrode 34.

The protective diode 22 is formed on the side of the gate electrode pad 5 close to the outer circumference of the semiconductor device and is connected to the gate electrode pad 5 and the drain electrode 35. A semiconductor layer and a capacitive component region (not illustrated) which is provided so as to come into contact with the lower surface of the semiconductor layer (a semiconductor-substrate-side surface (not illustrated)) and improves the static electricity resistance of the temperature detecting diode 1 are formed in a portion below the anode metal wiring line 6 (a portion that is arranged closer to the semiconductor substrate than the anode metal wiring line 6 in the depth direction of the plane of paper) and in a portion below the cathode metal wiring line 7 (a portion closer to the semiconductor substrate than the cathode metal wiring line 7).

A capacitive component region (not illustrated) is also formed in a portion (a portion closer to the semiconductor substrate than the temperature detecting diode 1) below temperature detecting diode 1 and in a portion (a portion closer to the semiconductor substrate than the protective diodes 21 and 22) below the protective diodes 21 and 22. Therefore, it is possible to improve the static electricity resistance of the temperature detecting diode 1 and the protective diodes 21 and 22, without reducing the area of the active region 8. The temperature detecting diode 1 and the protective diodes 21 and 22 may be independently formed according to the purpose of use or they may be combined with each other.

As described above, according to Embodiment 1, the capacitive component region is formed below the anode metal wiring line 6 that connects the temperature detecting diode 1 and the anode electrode pad 3 and below the cathode metal wiring line 7 that connects the temperature detecting diode 1 and the cathode electrode pad 4. Therefore, it is possible to improve the static electricity resistance of the temperature detecting diode 1. In addition, according to Embodiment 1, the capacitive component region is formed below the temperature detecting diode 1 and the protective diodes 21 and 22. Therefore, it is possible to improve the static electricity resistance of the temperature detecting diode 1 and the protective diodes 21 and 22, without reducing the area of the active region 8.

Embodiment 2

Figure 2:
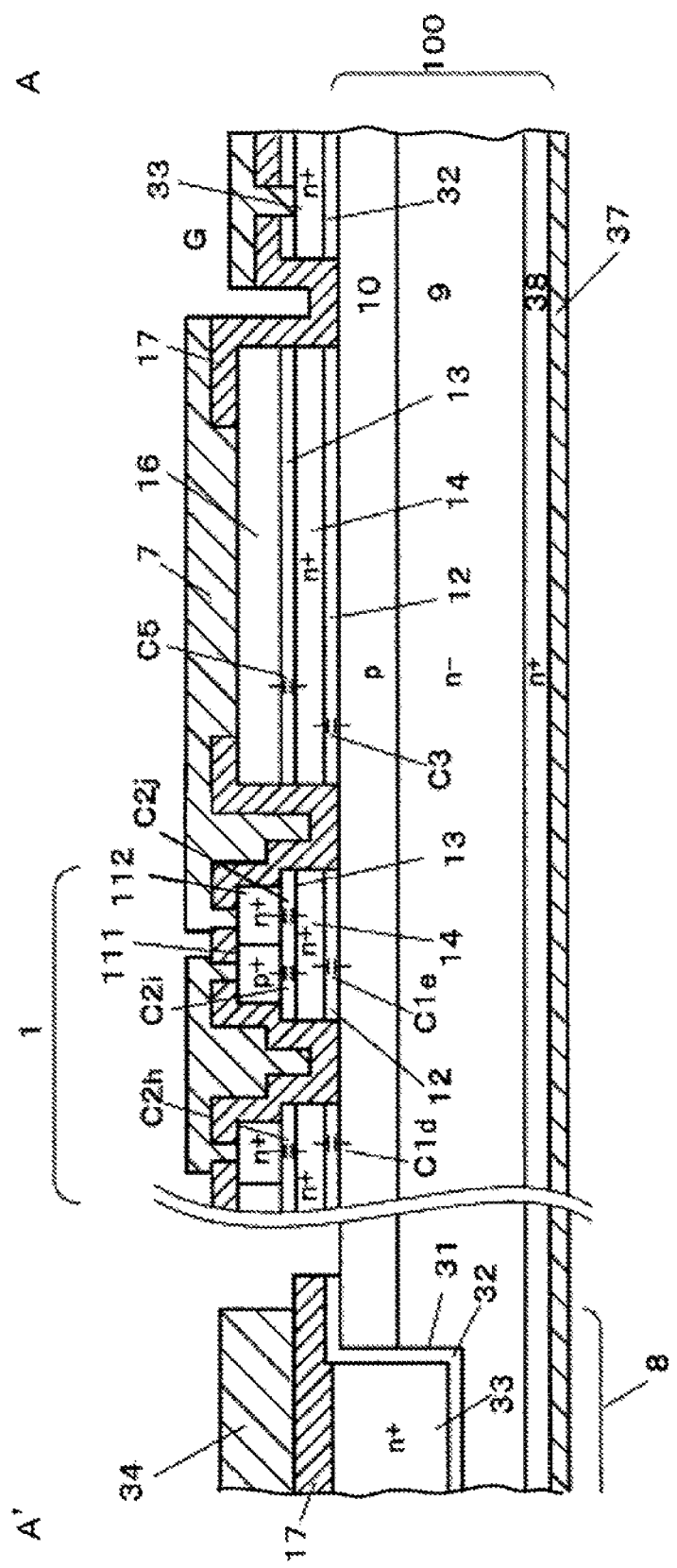
FIG. 2 is a cross-sectional view illustrating the structure of a semiconductor device according to Embodiment 2 of the invention.
Figure 3:
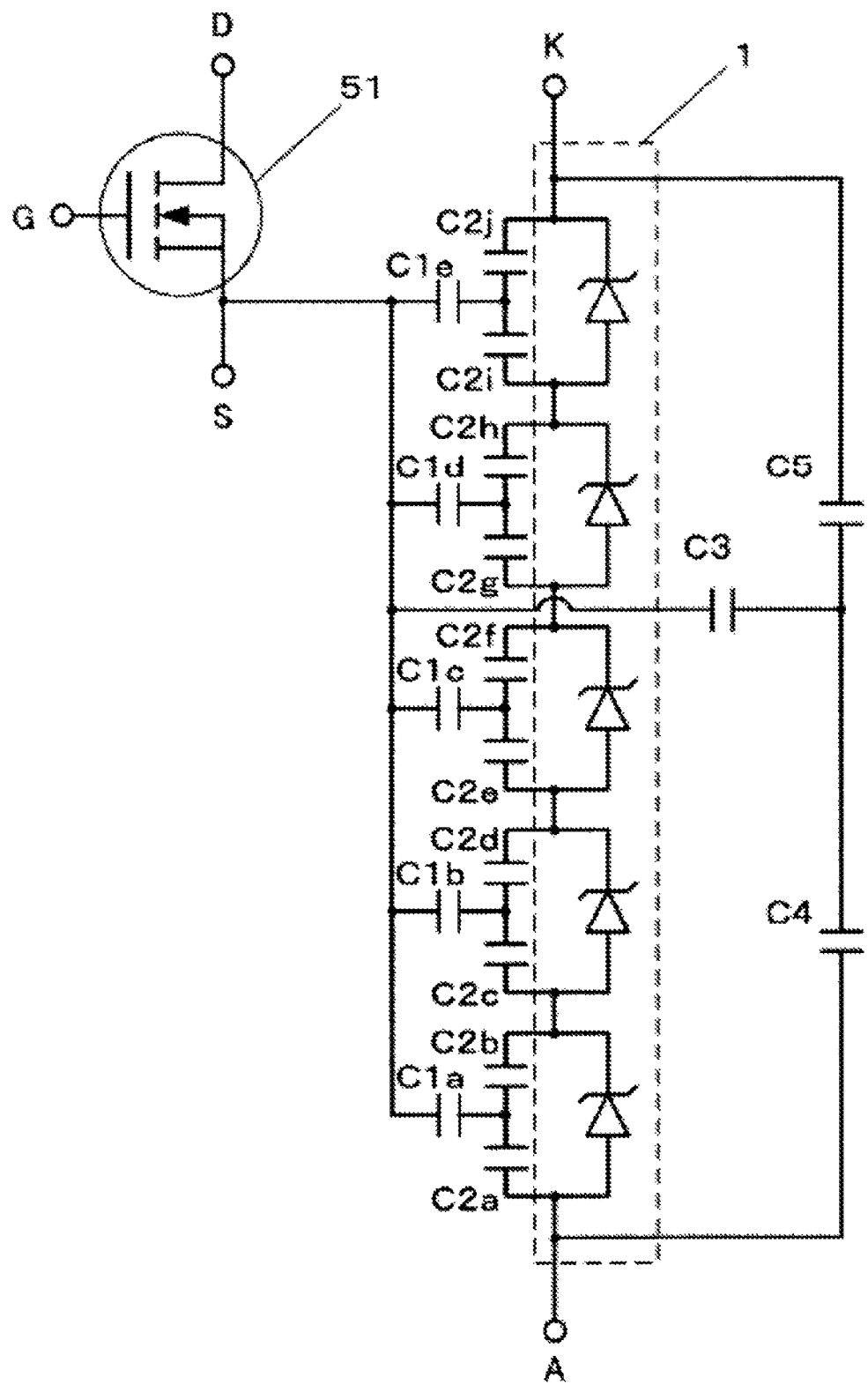
FIG. 3 is a circuit diagram illustrating the circuit structure of the semiconductor device according to Embodiment 2 of the invention.
Figure 4:
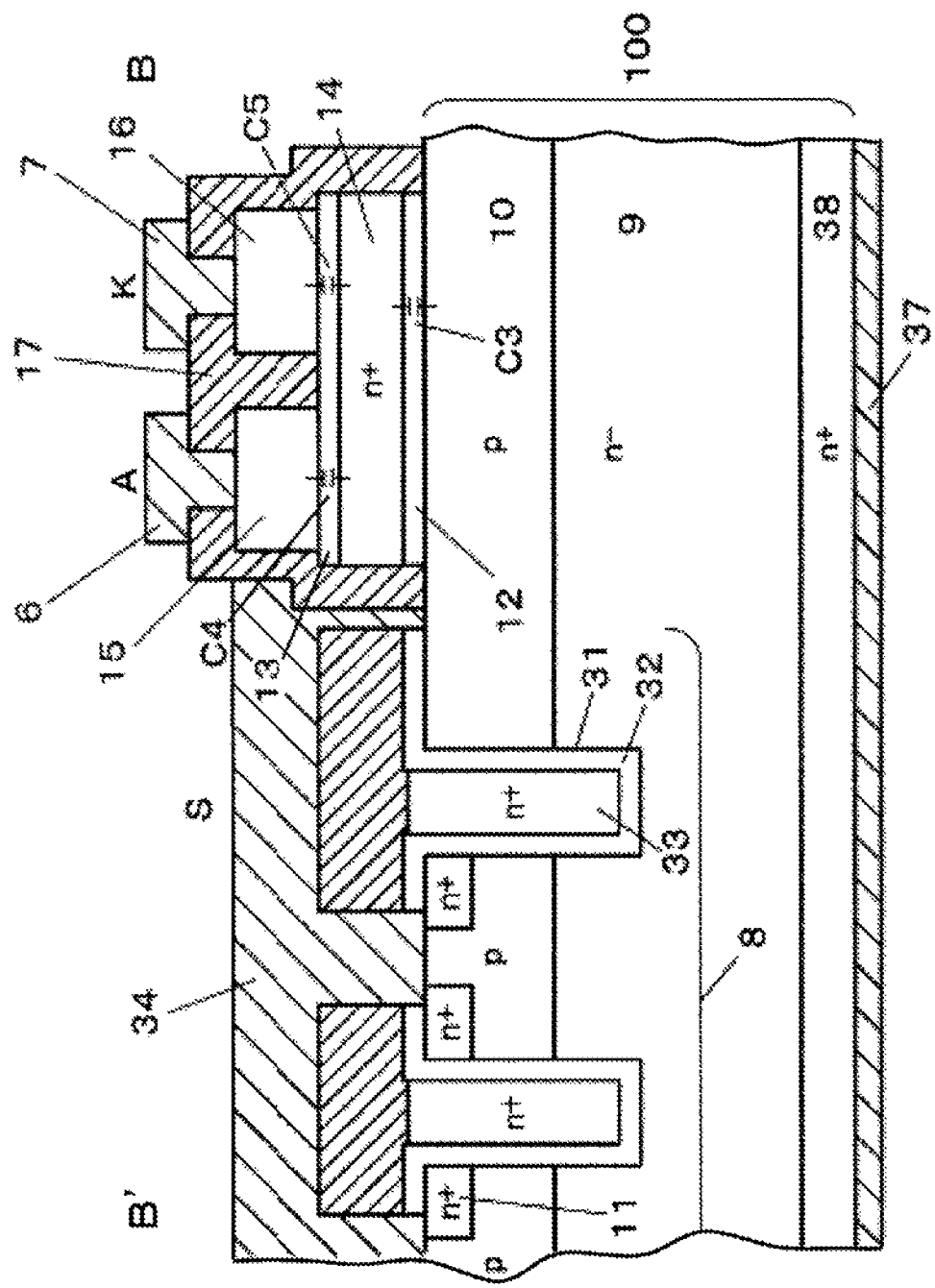
FIG. 4 is a cross-sectional view illustrating the structure of the semiconductor device according to Embodiment 2 of the invention.

The temperature detecting diode 1, the anode metal wiring line 6, and the cathode metal wiring line 7 according to Embodiment 1 will be described in detail as a semiconductor device according to Embodiment 2 of the invention. FIGS. 2 and 4 are cross-sectional views illustrating the structure of the semiconductor device according to Embodiment 2 of the invention. FIG. 3 is a circuit diagram illustrating the circuit structure of the semiconductor device according to Embodiment 2 of the invention. The planar structure of the semiconductor device according to Embodiment 2 is the same as the planar structure in Embodiment 1 illustrated in FIG. 1. FIG. 2 is a cross-sectional view illustrating a cross-sectional structure taken along the cutting line A-A' of FIG. 1(A). FIG. 3 is an equivalent circuit diagram of FIG. 2. FIG. 4 is a cross-sectional view illustrating a cross-sectional structure taken along the cutting line B-B' of FIG. 1(A).

As illustrated in FIGS. 2 to 4, in the semiconductor device according to Embodiment 2, an n⁻ first semiconductor layer 9, which will be a drift region of the MOSFET 51, is formed on the first main surface side of a semiconductor substrate 100. A p-type first semiconductor region 10, which will be a base region of the MOSFET 51, is formed in a surface layer (a surface layer close to the first main surface of the substrate; hereinafter, simply referred to as a surface layer) of the first semiconductor layer 9. An n⁺ drain region 38 is formed on the second main surface side of the semiconductor substrate 100. A drain electrode 37 is formed on the surface of the drain region 38 (the second main surface of the semiconductor substrate 100).

A trench 31 is formed in the active region 8 in which a current flows when the semiconductor device is turned on so as to extend from the first main surface of the semiconductor substrate 100 to the first semiconductor layer 9 through the first semiconductor region 10. A gate insulating film 32 is formed in the trench 31 along the inner wall of the trench 31. A gate electrode 33 is provided in the trench 31, with the gate insulating film 32 interposed therebetween. The gate insulating film 32 is an oxide film. The gate electrode 33 is covered with an interlayer insulating film 17 which is made of polysilicon doped with impurities (for example, n-type impurities). An n⁺ second semiconductor region 11, which will be a source region, is formed adjacent to the side wall of the trench 31. A source electrode 34 comes into contact (electrical contact) with the second semiconductor region 11 and the first semiconductor region 10.

A first insulating film 12 is formed on the first semiconductor region 10 (that is, on the first main surface of the semiconductor substrate 100) in a portion (a portion which is closer to the semiconductor substrate 100 than the temperature detecting diode 1) below the temperature detecting diode 1. The first insulating film 12 is an oxide film. The thickness of the first insulating film 12 is equal to or greater than the thickness of the gate insulating film 32 in terms of voltage breakdown due to, for example, static electricity or overvoltage. An n⁺ conductive layer 14 which is made of polysilicon doped with impurities is formed on the upper surface (the surface opposite to the semiconductor substrate 100) of the first insulating film 12. A second insulating film 13 is formed on the upper surface of the conductive layer 14. The temperature detecting diode 1 which is made of polysilicon is formed on the upper surface of the second insulating film 13. The second insulating film 13 is an oxide film. The thickness of the second insulating film 13 is equal to or greater than the thickness of the gate insulating film 32 in terms of voltage breakdown due to, for example, electrostatic or overvoltage.

The temperature detecting diode 1 is formed by connecting a plurality of zener diodes, each including a p⁺ layer 111 and an n⁺ layer 112, in series to each other. The p⁺ layer 111 is made of, for example, polysilicon doped with boron (B). The n⁺ layer 112 is made of, for example, polysilicon doped with arsenic (As) or phosphorus (P).

The anode metal wiring line 6 connects the temperature detecting diode 1 and the anode electrode pad 3. In a portion (a portion which is closer to the semiconductor substrate 100 than the anode metal wiring line 6) below the anode metal wiring line 6, the first insulating film 12, which is an oxide film having a thickness that is equal to or greater than the thickness of the gate insulating film 32, is formed on the first semiconductor region 10. The conductive layer 14 which is made of polysilicon is formed on the upper surface of the first insulating film 12. The second insulating film 13, which is an oxide film having a thickness that is equal to or greater than the thickness of the gate insulating film 32, is formed on the upper surface of the conductive layer 14. A first semiconductor layer 15 is formed on the upper surface of the second insulating film 13.

The cathode metal wiring line 7 connects the temperature detecting diode 1 and the cathode electrode pad 4. In a portion (a portion which is closer to the semiconductor substrate 100 than the cathode metal wiring line 7) below the cathode metal wiring line 7, the first having a thickness that is equal to or greater than the thickness of the gate insulating film 32, is formed on the first semiconductor region 10. The conductive layer 14 which is made of polysilicon is formed on the upper surface of the first insulating film 12. The second insulating film 13, which is an oxide film having a thickness that is equal to or greater than the thickness of the gate insulating film 32, is formed on the upper surface of the conductive layer 14. A second semiconductor layer 16 is formed on the upper surface of the second insulating film 13.

The first semiconductor layer 15 and the second semiconductor layer 16 are made of polysilicon doped with impurities. The thickness of the first semiconductor layer 15 and the second semiconductor layer 16 is in the range of, for example, about 0.5 µm to 1 µm. The formation of polysilicon, ion implantation, and thermal diffusion for forming the first semiconductor layer 15 and the second semiconductor layer 16 are performed in the same step as the formation of the temperature detecting diode 1. The conductivity type of the first semiconductor layer 15 and the second semiconductor layer 16 may be a p type or an n type. When polysilicon is, for example, a p type, boron can be used as the impurities added to polysilicon. When polysilicon is an n type, arsenic or phosphorus can be used as the impurities.

The first semiconductor layer 15 below the anode metal wiring line 6 and the second semiconductor layer 16 below the cathode metal wiring line 7 are formed on the same first semiconductor region 10, the same first insulating film 12, the same conductive layer 14, and the same second insulating film 13.

The temperature detecting diode 1, the first semiconductor layer 15 below the anode metal wiring line 6, and the second semiconductor layer 16 below the cathode metal wiring line 7 are formed on the same first semiconductor region 10, the same first insulating film 12, the same conductive layer 14, and the same second insulating film 13.

The conductive layer 14 is made of, for example, polysilicon doped with n-type impurities at an impurity concentration of $4 \times 10^{20}$ cm$^{-3}$ to $5 \times 10^{20}$ cm$^{-3}$. For example, the conductive layer 14 is formed at the same time as the gate electrode 33 provided in the trench 31. Therefore, the conductive layer 14 may have a thickness required to fill the trench 31. In Embodiment 2 of the invention, the thickness of the conductive layer 14 may be, for example, about 0.5 µm.

The conductive layer 14 is electrically insulated from the gate electrode 33, the source electrode 34, the drain electrode 35, the anode electrode, and the cathode electrode by the interlayer insulating film 17 and the second insulating film 13. In this way, it is possible to prevent the adverse effect of a surge voltage applied to each electrode on the conductive layer 14.

As such, the first insulating film 12, the conductive layer 14, and the second insulating film 13 are formed on the first semiconductor region 10 and the temperature detecting diode 1 is provided on the upper surface of the second insulating film 13. Therefore, it is possible to form a capacitor C2 (C2a to C2j) which has the second insulating film 13 between the temperature detecting diode 1 and the conductive layer 14 as the capacitive component region. In addition, it is possible to form a capacitor C1 (C1a to C1e) which has the first insulating film 12 between the conductive layer 14 and the first semiconductor region 10 as the capacitive component region.

The first insulating film 12, the conductive layer 14, and the second insulating film 13 are formed on the first semiconductor region 10 and the first semiconductor layer 15 is provided on the upper surface of the second insulating film 13. Therefore, it is possible to form a capacitor C4 which has, as the capacitive component region, the second insulating film 13 provided between the conductive layer 14 and the first semiconductor layer 15 below the anode metal wiring line 6. In addition, the first insulating film 12, the conductive layer 14, and the second insulating film 13 are formed on the first semiconductor region 10 and the second semiconductor layer 16 is provided on the upper surface of the second insulating film 13. Therefore, it is possible to form a capacitor C5 which has, as the capacitive component region, the second insulating film 13 provided between the conductive layer 14 and the second semiconductor layer 16 below the cathode metal wiring line 7. In addition, it is possible to form a capacitor C3 which has the first insulating film 12 between the conductive layer 14 and the first semiconductor region 10 as the capacitive component region.

In order to form the capacitor C4 and the capacitor C5 which have the second insulating film 13 as the capacitive component region, the anode metal wiring line 6 and the cathode metal wiring line 7 can be directly formed on the upper surface of the second insulating film 13, without forming the first semiconductor layer 15 and the second semiconductor layer 16. However, this structure is not preferable for the following reason. Before the anode metal wiring line 6 and the cathode metal wiring line 7 are formed, a step of covering the first main surface of the semiconductor substrate 100 with the interlayer insulating film 17 and etching the interlayer insulating film 17 is performed. When the first semiconductor layer 15 and the second semiconductor layer 16 are not formed on the upper surface of the second insulating film 13, etching residue or damage occurs in the surface of the second insulating film 13 due to the step of etching the interlayer insulating film 17. As a result, a variation in the thickness of the second insulating film 13 occurs and a variation in the capacitive component region occurs.

Therefore, when the first semiconductor layer 15 and the second semiconductor layer 16 are formed on the upper surface of the second insulating film 13, it is possible to form the capacitor C4 and the capacitor C5 having a stable capacitive component region, without being affected by the etching of the interlayer insulating film 17.

The thickness of the second insulating film 13 can be changed to adjust the capacitance of the capacitor C2, the capacitor C4, and the capacitor C5, each having the second insulating film 13 as the capacitive component region, to necessary static electricity resistance.

For example, when the temperature detecting diode 1 has an electrostatic breakdown voltage of about 200 V, a capacitance of about 90 pF is required. Therefore, the thickness of the second insulating film 13 may be equal to or greater than the thickness of the gate insulating film 32 and equal to or less than 1000 Å.

The thickness of the first insulating film 12 may be equal to or greater than the thickness of the gate insulating film 32. The thickness of the first insulating film 12 may be equal to or greater than the thickness of the gate insulating film 32 and equal to or less than 1000 Å, in order to use the first insulating film 12 between the conductive layer 14 and the first semiconductor region 10 as the capacitive component region. When the first insulating film 12 is not used as the capacitive component region, the upper limit of the thickness of the first insulating film 12 is not particularly limited. For example, the thickness of the first insulating film 12 can be equal to the thickness of a field oxide film (not illustrated) which is formed on the first main surface (surface) of the semiconductor substrate 100.

As described above, according to Embodiment 2, since the capacitive component region is formed between the conductive layer 14 and the temperature detecting diode 1, it is possible to improve the static electricity resistance of the temperature detecting diode 1, without increasing the area of the temperature detecting diode 1. In addition, according to Embodiment 2, since the capacitive component region is formed between the conductive layer 14 and the first semiconductor region 10 below the temperature detecting diode 1, it is possible to further improve the static electricity resistance of the temperature detecting diode 1.

According to Embodiment 2, since the capacitive component region is formed between the conductive layer 14 and the first and second semiconductor layers 15 and 16 below the anode metal wiring line 6 and the cathode metal wiring line 7, it is possible to improve the static electricity resistance of the temperature detecting diode 1, without reducing the area of the active region 8. In addition, according to Embodiment 2, since the capacitive component region is formed between the conductive layer 14 and the first semiconductor region 10 below the anode metal wiring line 6 and the cathode metal wiring line 7, it is possible to further improve the static electricity resistance of the temperature detecting diode 1.

Embodiment 3

Figure 5:
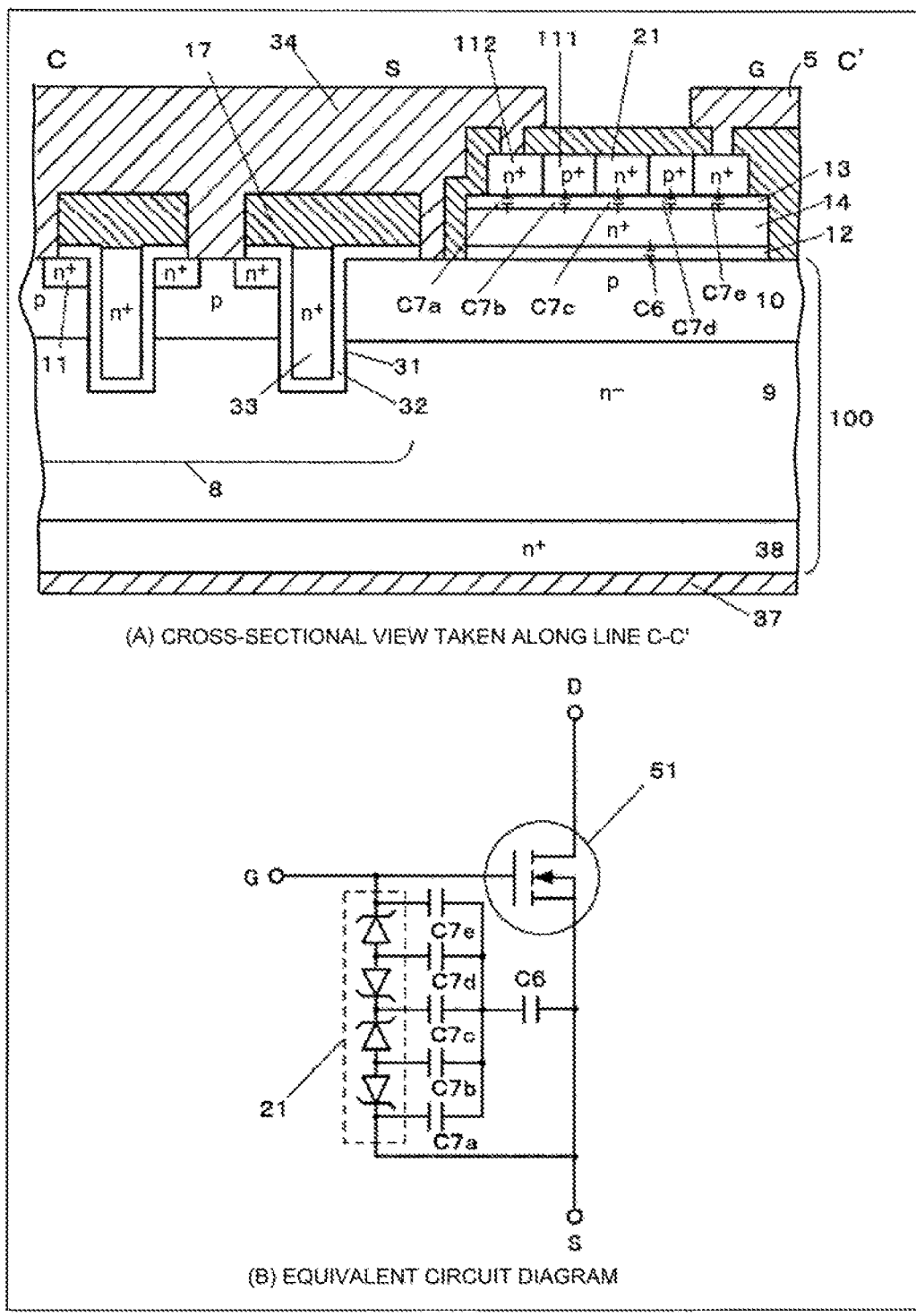
FIG. 5 is a diagram illustrating the structure of a semiconductor device according to Embodiment 3 of the invention.

The protective diode 21 according to Embodiment 1 will be described in detail as a semiconductor device according to Embodiment 3 of the invention. FIG. 5 is a diagram illustrating the structure of the semiconductor device according to Embodiment 3 of the invention. The planar structure of the semiconductor device according to Embodiment 3 is the same as the planar structure in Embodiment 1 illustrated in FIG. 1. FIG. 5(A) is a cross-sectional view illustrating a cross-sectional structure taken along the cutting line C-C' of FIG. 1(A) and FIG. 5(B) is an equivalent circuit diagram of FIG. 5(A).

As illustrated in FIG. 5, in the semiconductor device according to Embodiment 3, the $n^-$ first semiconductor layer 9, which will be the drift region of the MOSFET 51, is formed on the first main surface side of the semiconductor substrate 100. The p-type first semiconductor region 10, which will be the base region of the MOSFET 51, is formed in a surface layer of the first semiconductor layer 9. The $n^+$ drain region 38 is formed on the second main surface side of the semiconductor substrate 100. The drain electrode 37 is formed on the surface of the drain region 38.

The trench 31 is formed in the active region 8 so as to extend from the first main surface of the semiconductor substrate 100 to the first semiconductor layer 9 through the first semiconductor region 10. The gate insulating film 32 is formed in the trench 31 along the inner wall of the trench 31. In addition, the gate electrode 33 is provided in the trench 31, with the gate insulating film 32 interposed therebetween. The gate insulating film 32 is an oxide film. The gate electrode 33 is covered with the interlayer insulating film 17 which is made of polysilicon doped with impurities. The $n^+$ second semiconductor region 11, which will be a source region, is formed adjacent to the side wall of the trench 31. The source electrode 34 comes into contact with the second semiconductor region 11 and the first semiconductor region 10.

The protective diode 21 is arranged between the source electrode 34 and the gate electrode pad 5. The first insulating film 12 is formed on the first semiconductor region 10 below the protective diode 21. The first insulating film 12 is an oxide film. The thickness of the first insulating film 12 is equal to or greater than the thickness of the gate insulating film 32 in terms of voltage breakdown due to, for example, static electricity or overvoltage. The $n^+$ conductive layer 14 which is made of polysilicon doped with impurities is formed on the upper surface of the first insulating film 12. The second insulating film 13 is formed on the upper surface of the conductive layer 14. The protective diode 21 which is made of polysilicon is formed on the upper surface of the second insulating film 13. The protective diode 21 is connected between the gate G (gate electrode pad 5) and the source S (source electrode 34). The second insulating film 13 is an oxide film. The thickness of the second insulating film 13 is equal to or greater than the thickness of the gate insulating film 32 in terms of voltage breakdown due to, for example, static electricity or overvoltage.

The protective diode 21 provided between the gate G and the source S is a multi-stage bidirectional zener diode including the $p^+$ layer 111 and the $n^+$ layer 112. That is, in the protective diode 21, the $p^+$ layer 111 and the $n^+$ layer 112 are alternately arranged in the direction in which the $p^+$ layer 111 and the $n^+$ layer 112 are arranged in a line. The $n^+$ layers 112 are provided at both ends of the protective diode 21. The $n^+$ layer 112 provided at one end is connected to the gate G and the $n^+$ layer 112 provided at the other end is connected to the source S. The $p^+$ layer 111 is made of polysilicon doped with, for example, boron. The $n^+$ layer 112 is made of polysilicon doped with, for example, arsenic or phosphorus.

The conductive layer 14 is made of, for example, polysilicon doped with n-type impurities at an impurity concentration of $4 \times 10^{20}$ cm$^{-3}$ to $5 \times 10^{20}$ cm$^{-3}$. For example, the conductive layer 14 is formed at the same time as the gate electrode 33 provided in the trench 31. Therefore, the conductive layer 14 may have a thickness required to fill the trench 31. In this embodiment, the thickness of the conductive layer 14 may be, for example, about 0.5 µm.

The conductive layer 14 is electrically insulated from the gate electrode 33, the source electrode 34, the drain electrode 35, the anode electrode, and the cathode electrode by the interlayer insulating film 17 and the second insulating film 13. Therefore, it is possible to prevent the adverse effect of a surge voltage applied to each electrode on the conductive layer 14.

As such, the first insulating film 12, the conductive layer 14, and the second insulating film 13 are formed on the first semiconductor region 10 and the protective diode 21 is provided on the upper surface of the second insulating film 13. Therefore, it is possible to form a capacitor C7 (C7a to C7e) which has the second insulating film 13 provided between the protective diode 21 and the conductive layer 14 as a capacitive component region. In addition, it is possible to form a capacitor C6 which has the first insulating film 12 provided between the conductive layer 14 and the first semiconductor region 10 as a capacitive component region.

The thickness of the second insulating film 13 can be changed to adjust the capacitance of the capacitor C7, which has the second insulating film 13 as the capacitive component region, to necessary static electricity resistance. For example, when the protective diode 21 has an electrostatic breakdown voltage of about 200 V, a capacitance of about 90 pF is required. Therefore, the thickness of the second insulating film 13 may be equal to or greater than the thickness of the gate insulating film 32 and equal to or less than 1000 Å.

The thickness of the first insulating film 12 may be equal to or greater than the thickness of the gate insulating film 32. The thickness of the first insulating film 12 may be equal to or greater than the thickness of the gate insulating film 32 and equal to or less than 1000 Å, in order to use the first insulating film 12 between the conductive layer 14 and the first semiconductor region 10 as the capacitive component region. When the first insulating film 12 is not used as the capacitive component region, the upper limit of the thickness of the first insulating film 12 is not particularly limited. For example, the thickness of the first insulating film 12 can be equal to the thickness of a field oxide film (not illustrated) which is formed on the first main surface of the semiconductor substrate 100.

As described above, according to Embodiment 3, since the capacitive component region is formed between the conductive layer 14 and the protective diode 21, it is possible to improve the static electricity resistance of the protective diode 21, without increasing the area of the protective diode 21. In addition, according to Embodiment 3, since the capacitive component region is formed between the conductive layer 14 and the first semiconductor region 10 below the protective diode 21, it is possible to further improve the static electricity resistance of the protective diode 21.

Embodiment 4

Figure 6:
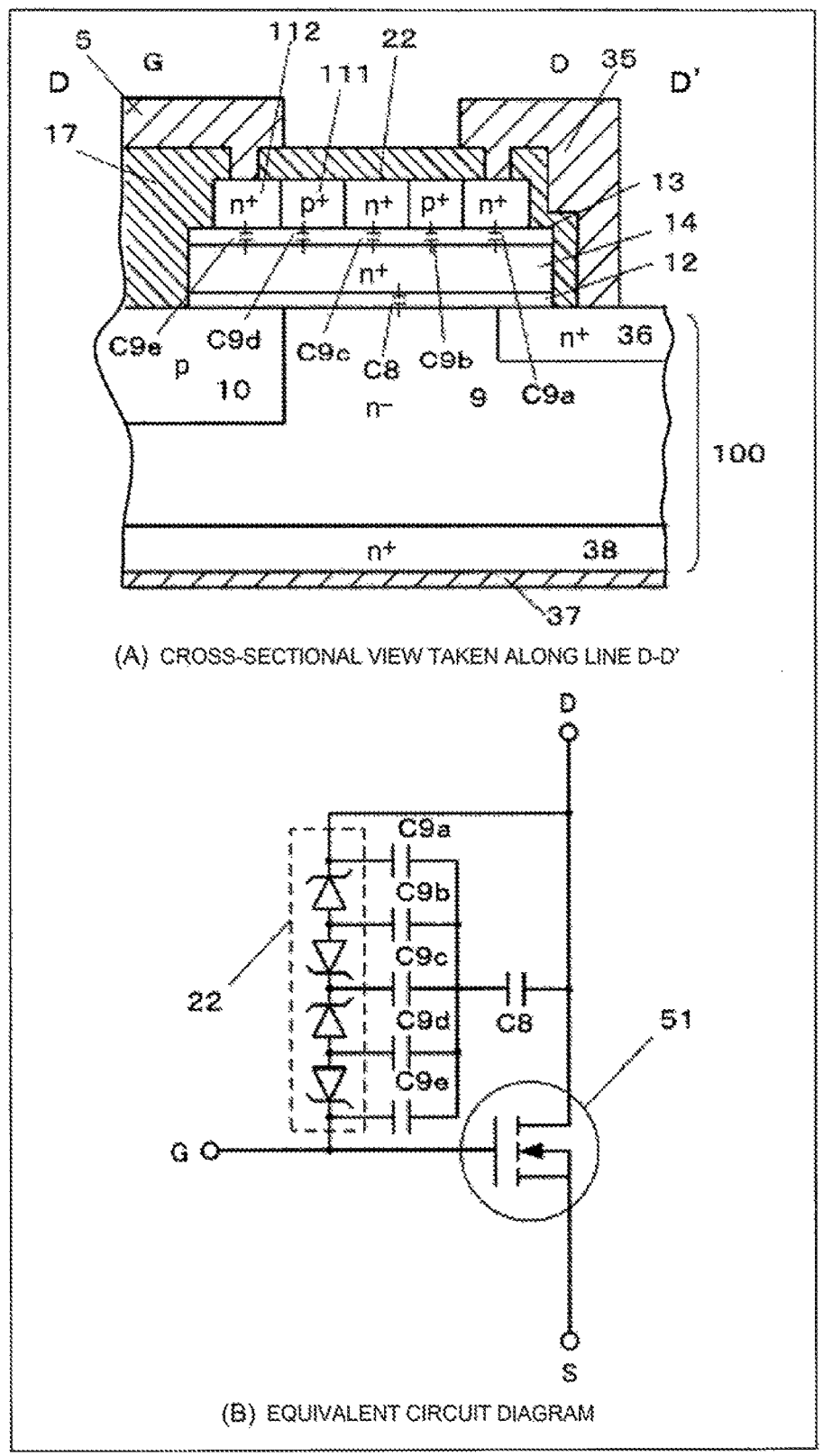
FIG. 6 is a diagram illustrating the structure of a semiconductor device according to Embodiment 4 of the invention.

The protective diode 22 according to Embodiment 1 will be described in detail as a semiconductor device according to Embodiment 4 of the invention. FIG. 6 is a diagram illustrating the structure of the semiconductor device according to Embodiment 4 of the invention. The planar structure of the semiconductor device according to Embodiment 4 is the same as the planar structure in Embodiment 1 illustrated in FIG. 1. FIG. 6(A) is a cross-sectional view illustrating a cross-sectional structure taken along the cutting line D-D' of FIG. 1(A) and FIG. 6(B) is an equivalent circuit diagram of FIG. 6(A).

As illustrated in FIG. 6, in the semiconductor device according to Embodiment 4, the n⁻ first semiconductor layer 9, which will be the drift region of the MOSFET 51, is formed on the first main surface side of the semiconductor substrate 100. The p-type first semiconductor region 10, which will be the base region of the MOSFET 51, is formed in a surface layer of the first semiconductor layer 9 close to the gate electrode pad 5 (the inside). An n⁺ drain region 36 is formed in a surface layer of the first semiconductor layer 9 close to a drain electrode 35 (outer circumferential side). The n⁺ drain region 38 is formed on the second main surface side of the semiconductor substrate 100. The drain electrode 37 is formed on the surface of the drain region 38.

The protective diode 22 is arranged between the gate electrode pad 5 and the drain electrode 35. The first insulating film 12 is formed on the first main surface of the semiconductor substrate 100 so as to extend over the first semiconductor region 10 close to the gate electrode pad 5 and the drain region 36 close to the drain electrode 35. The first insulating film 12 is an oxide film. The thickness of the first insulating film 12 is equal to or greater than the thickness of the gate insulating film 32 in terms of voltage breakdown due to, for example, static electricity or overvoltage. The n⁺ conductive layer 14 which is made of polysilicon doped with impurities is formed on the upper surface of the first insulating film 12. The second insulating film 13 is formed on the upper surface of the conductive layer 14. The protective diode 22 which is made of polysilicon is formed on the upper surface of the second insulating film 13. The protective diode 22 is connected between the gate G (gate electrode pad 5) and the drain D (drain electrode 35). The second insulating film 13 is an oxide film. The thickness of the second insulating film 13 is equal to or greater than the thickness of the gate insulating film 32 in terms of voltage breakdown due to, for example, electrostatic or overvoltage.

The protective diode 22 provided between the gate G and the drain D is a multi-stage bidirectional zener diode including the p⁺ layer 111 and the n⁺ layer 112. That is, in the protective diode 22, the p⁺ layer 111 and the n⁺ layer 112 are alternately arranged in the direction in which the p⁺ layer 111 and the n⁺ layer 112 are arranged in a line. The n⁺ layers 112 are provided at both ends of the protective diode 22. The n⁺ layer 112 provided at one end is connected to the gate G and the n⁺ layer 112 provided at the other end is connected to the drain D. The p⁺ layer 111 is made of polysilicon doped with, for example, boron. The n⁺ layer 112 is made of polysilicon doped with, for example, arsenic or phosphorus.

The conductive layer 14 is made of, for example, polysilicon doped with n-type impurities at an impurity concentration of $4 \times 10^{20}$ cm⁻³ to $5 \times 10^{20}$ cm⁻³. For example, the conductive layer 14 is formed at the same time as the gate electrode 33 provided in the trench 31. Therefore, the conductive layer 14 may have a thickness required to fill the trench 31. In this embodiment, the thickness of the conductive layer 14 may be, for example, about 0.5 μm.

The conductive layer 14 is electrically insulated from the gate electrode 33, the source electrode 34, the drain electrode 35, the anode electrode, and the cathode electrode by the interlayer insulating film 17 and the second insulating film 13. Therefore, it is possible to prevent the adverse effect of a surge voltage applied to each electrode on the conductive layer 14.

As such, the first insulating film 12, the conductive layer 14, and the second insulating film 13 are formed on the first semiconductor region 10 and the protective diode 22 is provided on the upper surface of the second insulating film 13. Therefore, it is possible to form a capacitor C9 (C9a to C9e) which has the second insulating film 13 provided between the protective diode 22 and the conductive layer 14 as a capacitive component region. In addition, it is possible to form a capacitor C8 which has the first insulating film 12 provided between the conductive layer 14 and the semiconductor substrate 100 as a capacitive component region.

The thickness of the second insulating film 13 can be changed to adjust the capacitance of the capacitor C9, which has the second insulating film 13 as the capacitive component region, to necessary static electricity resistance. For example, when the protective diode 22 has an electrostatic breakdown voltage of about 200 V, a capacitance of about 90 pF is required. Therefore, the thickness of the second insulating film 13 may be equal to or greater than the thickness of the gate insulating film 32 and equal to or less than 1000 Å.

The thickness of the first insulating film 12 may be equal to or greater than the thickness of the gate insulating film 32. The thickness of the first insulating film 12 may be equal to or greater than the thickness of the gate insulating film 32 and equal to or less than 1000 Å, in order to use the first insulating film 12 between the conductive layer 14 and the semiconductor substrate 100 as the capacitive component region. When the first insulating film 12 is not used as the capacitive component region, the upper limit of the thickness of the first insulating film 12 is not particularly limited. For example, the thickness of the first insulating film 12 can be equal to the thickness of a field oxide film (not illustrated) which is formed on the first main surface of the semiconductor substrate 100.

As described above, according to Embodiment 4, the same effect as that in Embodiments 1 to 3 is obtained. In addition, according to Embodiment 4, since the capacitive component region is formed between the conductive layer 14 and the protective diode 22, it is possible to improve the static electricity resistance of the protective diode 22, without increasing the area of the protective diode 22. Furthermore, according to Embodiment 4, since the capacitive component region is formed between the first semiconductor region 10 and the conductive layer 14 below the protective diode 22, it is possible to further improve the static electricity resistance of the protective diode 22.

Embodiment 5

Figure 7:
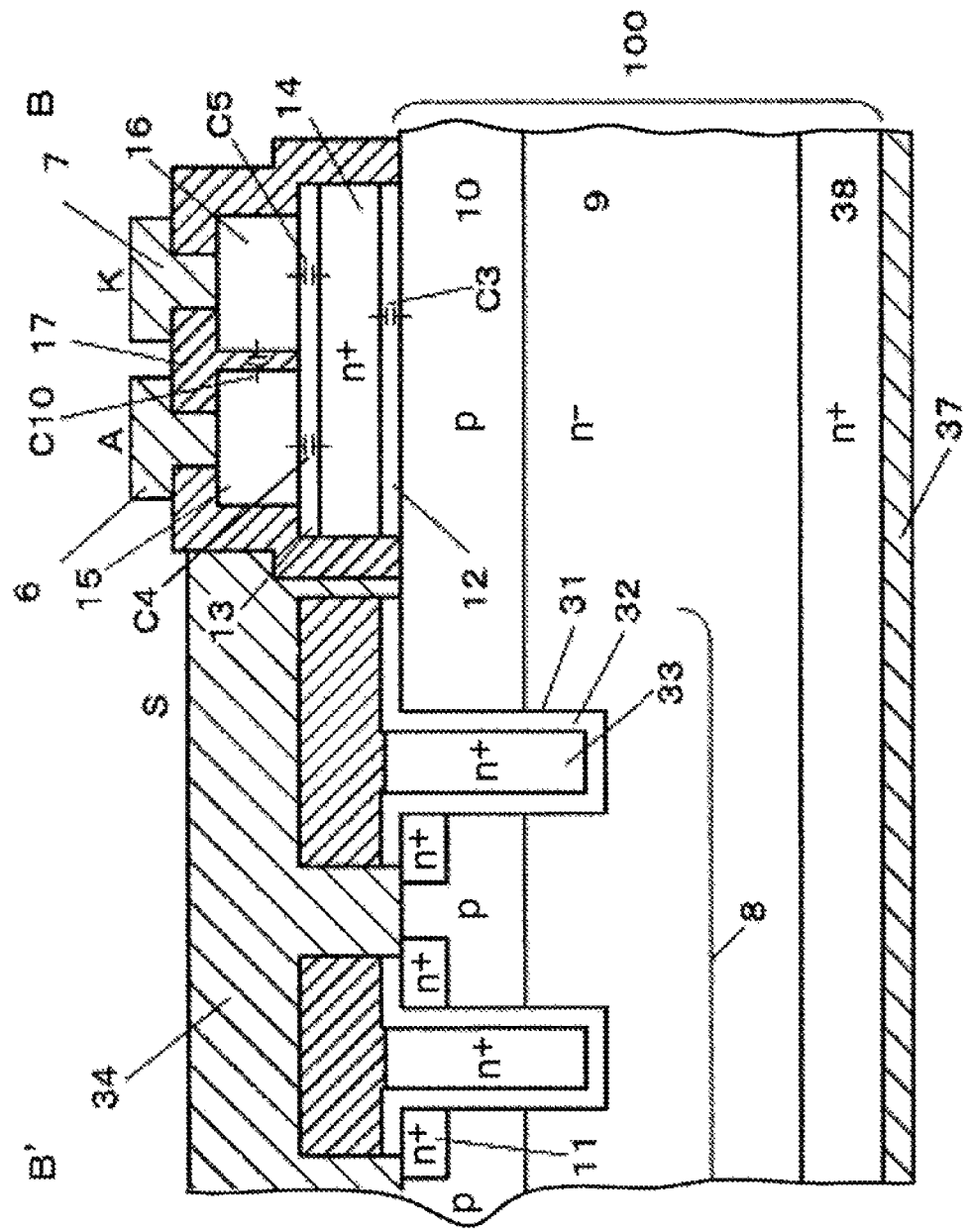
FIG. 7 is a cross-sectional view illustrating the structure of a semiconductor device according to Embodiment 5 of the invention.
Figure 8:
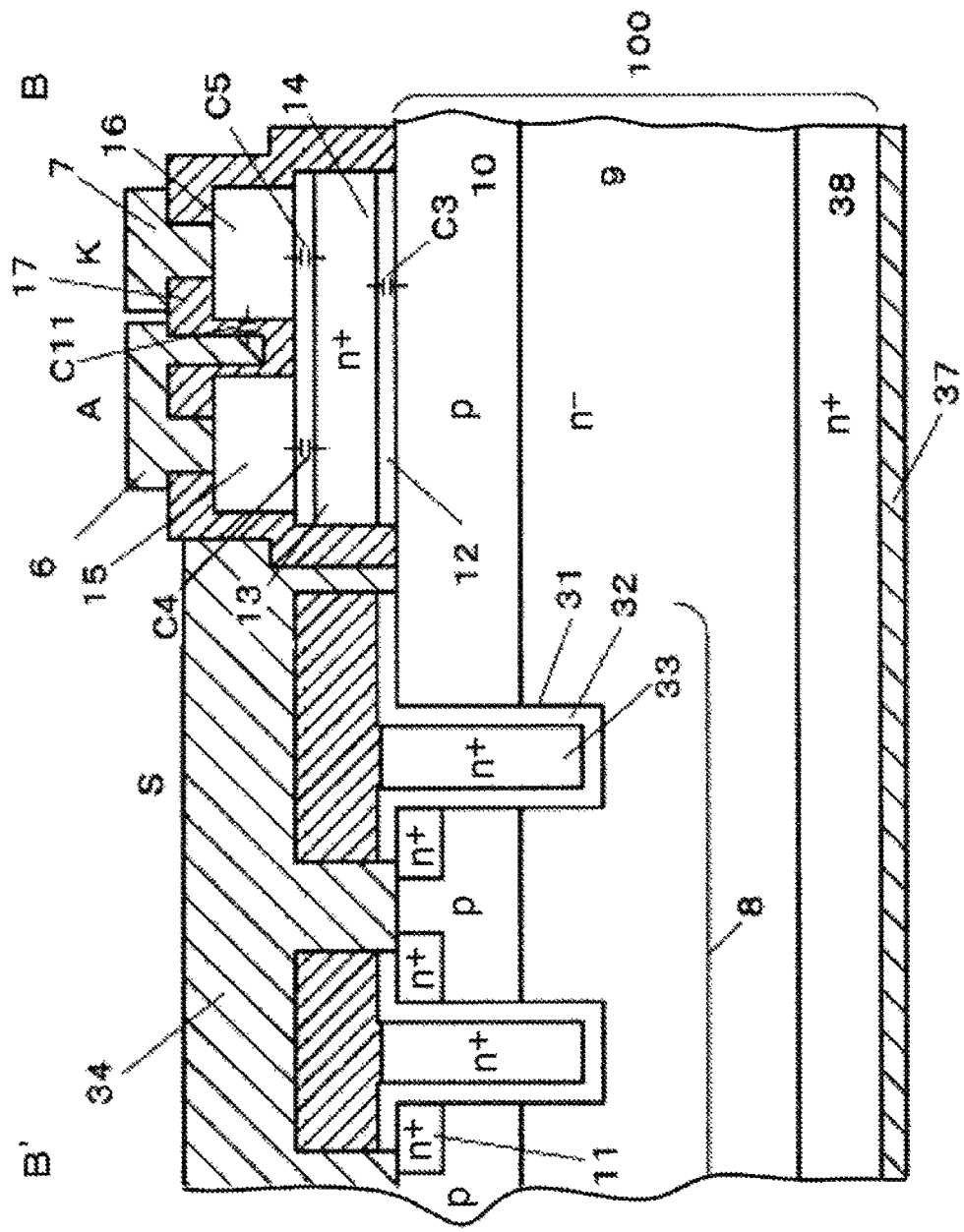
FIG. 8 is a cross-sectional view illustrating another example of the structure of the semiconductor device according to Embodiment 5 of the invention.

A semiconductor device according to Embodiment 5 will be described. FIG. 7 is a cross-sectional view illustrating the structure of the semiconductor device according to Embodiment 5 of the invention. FIG. 8 is a cross-sectional view illustrating another example of the structure of the semiconductor device according to Embodiment 5 of the invention. The semiconductor device according to Embodiment 5 is a modification of the semiconductor device according to Embodiment 2. The planar structure of the semiconductor device according to Embodiment 5 is the same as the planar structure in Embodiment 1 illustrated in FIG. 1. The semiconductor device according to Embodiment 5 differs from the semiconductor device according to Embodiment 2 in that a portion of an interlayer insulating film 17 interposed between a first semiconductor layer 15 and a second semiconductor layer 16 is a capacitive component region.

FIG. 7 is a cross-sectional view illustrating the cross-sectional structure of the semiconductor device according to Embodiment 5 taken along the cutting line B-B' of FIG. 1. The gap between the first semiconductor layer 15 below an anode metal wiring line 6 and the second semiconductor layer 16 below a cathode metal wiring line 7 is narrowed to form a capacitor C10 which has the interlayer insulating film 17 provided between the first semiconductor layer 15 and the second semiconductor layer 16 as the capacitive component region. The gap between the first semiconductor layer 15 and the second semiconductor layer 16 may be, for example, about 0.5 μm.

FIG. 8 is a cross-sectional view illustrating another example of the cross-sectional structure of the semiconductor device according to Embodiment 5 taken along the cutting line B-B' of FIG. 1. The interlayer insulating film 17 is formed such that a concave portion is provided between the first semiconductor layer 15 and the second semiconductor layer 16. Then, the anode metal wiring line 6 is formed so as to fill the concave portion of the interlayer insulating film 17. In this way, it is possible to form a capacitor C11 which has the interlayer insulating film 17 between the anode metal wiring line 6 and the second semiconductor layer 16 as a capacitive component region.

In the semiconductor devices illustrated in FIGS. 7 and 8, it is possible to form the capacitive component region below the anode metal wiring line 6 and the cathode metal wiring line 7 which are provided from the temperature detecting diode 1 to the anode electrode pad 3 and the cathode electrode pad 4, without reducing the area of the active region 8, and to improve the static electricity resistance of the temperature detecting diode 1.

As described above, according to Embodiment 5, the same effect as that in Embodiments 1 to 4 is obtained.

Embodiment 6

Figure 9:
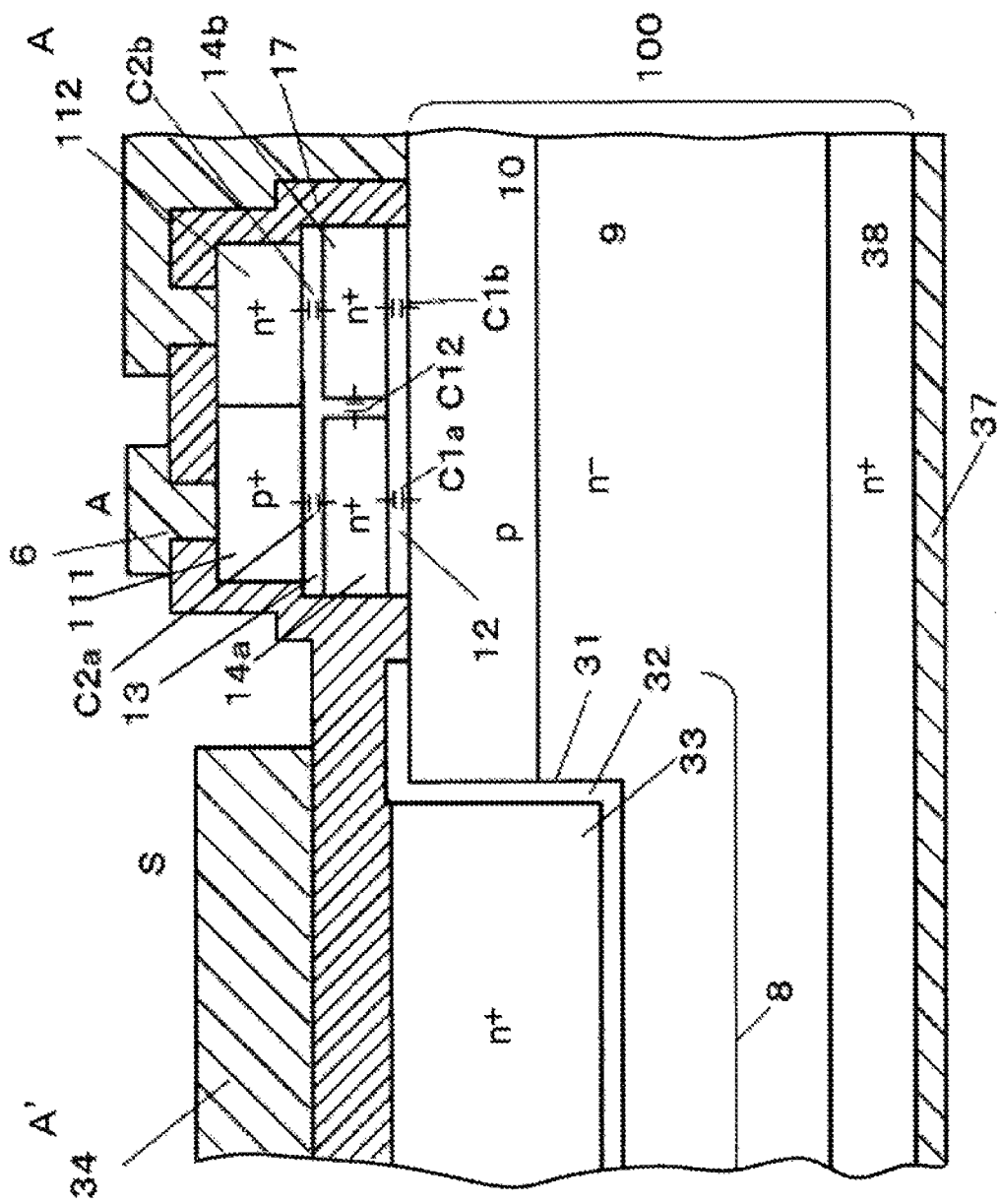
FIG. 9 is a cross-sectional view illustrating the structure of a semiconductor device according to Embodiment 6 of the invention.
Figure 10:
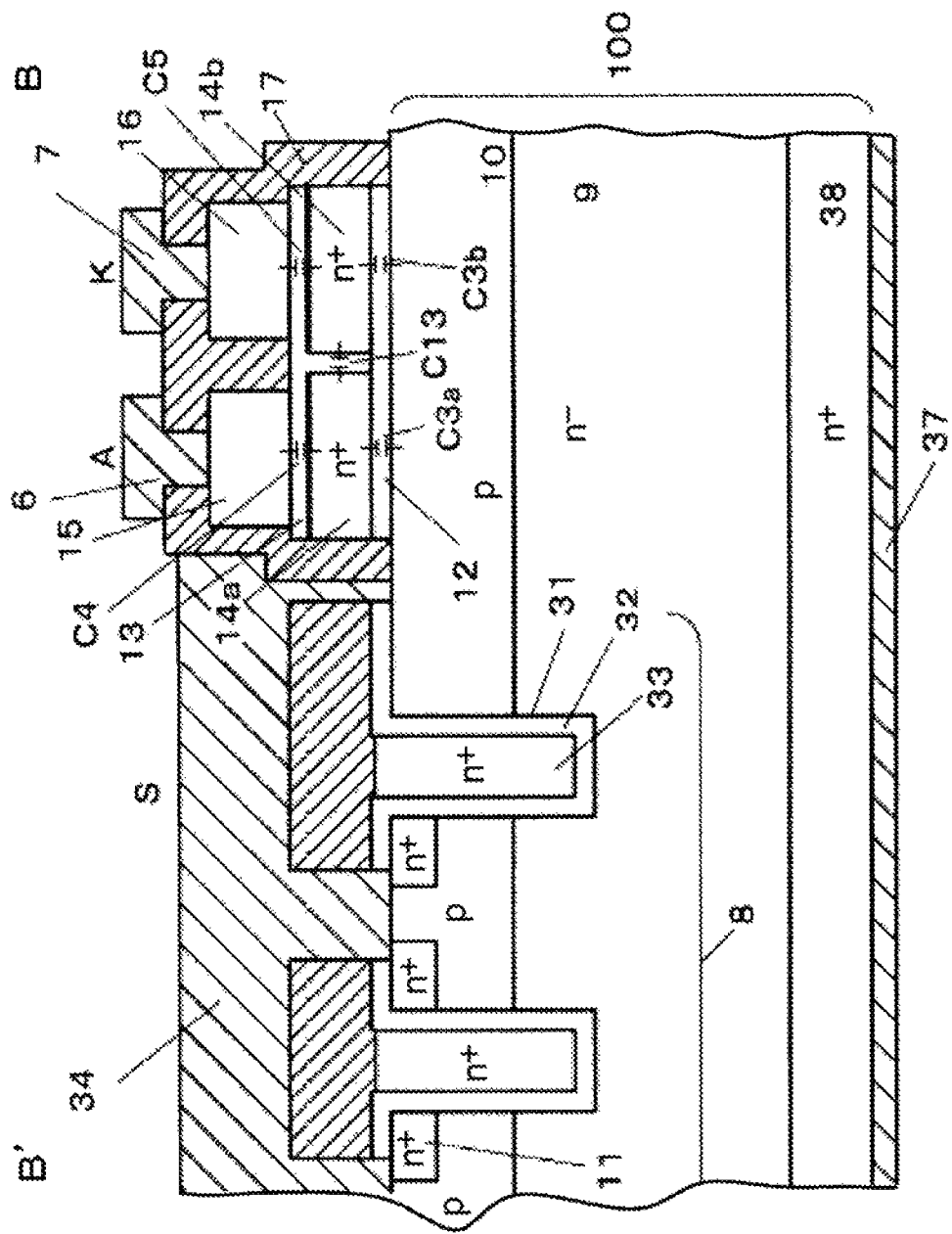
FIG. 10 is a cross-sectional view illustrating the structure of the semiconductor device according to Embodiment 6 of the invention.

A semiconductor device according to Embodiment 6 will be described. FIGS. 9 and 10 are cross-sectional views illustrating the structure of the semiconductor device according to Embodiment 6 of the invention. The semiconductor device according to Embodiment 6 is a modification of the semiconductor device according to Embodiment 2. The planar structure of the semiconductor device according to Embodiment 6 is the same as the planar structure in Embodiment 1 illustrated in FIG. 1. The semiconductor device according to Embodiment 6 differs from the semiconductor device according to Embodiment 2 in that a conductive layer 14 is divided into a plurality of parts by a second insulating film 13 which passes through the conductive layer 14 in the thickness direction.

FIG. 9 is a cross-sectional view illustrating the cross-sectional structure of a temperature detecting diode 1 taken along the cutting line A-A' of FIG. 1 in the semiconductor device according to Embodiment 6. The conductive layer 14 is divided into a conductive layer 14a and a conductive layer 14b for each conductivity-type layer (a $p^+$ layer 111 and an $n^+$ layer 112) of the temperature detecting diode 1 which is formed on the conductive layer 14 with the second insulating film 13 interposed therebetween. Specifically, the conductive layer 14 is divided into the conductive layer 14a which faces the $p^+$ layer 111, with the second insulating film 13 interposed therebetween, and the conductive layer 14b which faces the $n^+$ layer 112, with the second insulating film 13 interposed therebetween. A space between the divided conductive layers 14a and 14b is filled with the second insulating film 13. Therefore, it is possible to form a capacitor C12 which has the second insulating film 13 between the conductive layer 14a and the conductive layer 14b as a capacitive component region.

FIG. 10 is a cross-sectional view illustrating the cross-sectional structure of the semiconductor device according to Embodiment 6 taken along the cutting line B-B' of FIG. 1. The conductive layer 14 is divided into a conductive layer 14a close to the first semiconductor layer 15 that is formed on the conductive layer 14, with the second insulating film 13 interposed therebetween, and a conductive layer 14b close to the second semiconductor layer 16 that is formed on the conductive layer 14, with the second insulating film 13 interposed therebetween. That is, the conductive layer 14 is divided into the conductive layer 14a which faces the first semiconductor layer 15, with the second insulating film 13 interposed therebetween, and the conductive layer 14b which faces the second semiconductor layer 16, with the second insulating film 13 interposed therebetween. A space between the divided conductive layers 14a and 14b is filled with the second insulating film 13.

It is possible to form a capacitor C13 which has the second insulating film 13 between the conductive layer 14a and the conductive layer 14b as a capacitive component region. Reference numerals C3a and C3b denote capacitors which have the first insulating film 12 between the conductive layers 14a and 14b and the first semiconductor region 10 as a capacitive component region. As illustrated in FIGS. 9 and 10, the conductive layer 14 may be provided in portions which face each conductivity-type layer forming the element that is arranged on the upper surface of the conductive layer 14, with the second insulating film 13 interposed therebetween. For example, this structure can also be applied to the protective diode 21 between the gate G and the source S described in Embodiment 3 or the protective diode 22 between the gate G and the drain D described in Embodiment 4.

As described above, according to Embodiment 6, the same effect as that in Embodiments 1 to 5 is obtained.

Embodiment 7

Figure 11:
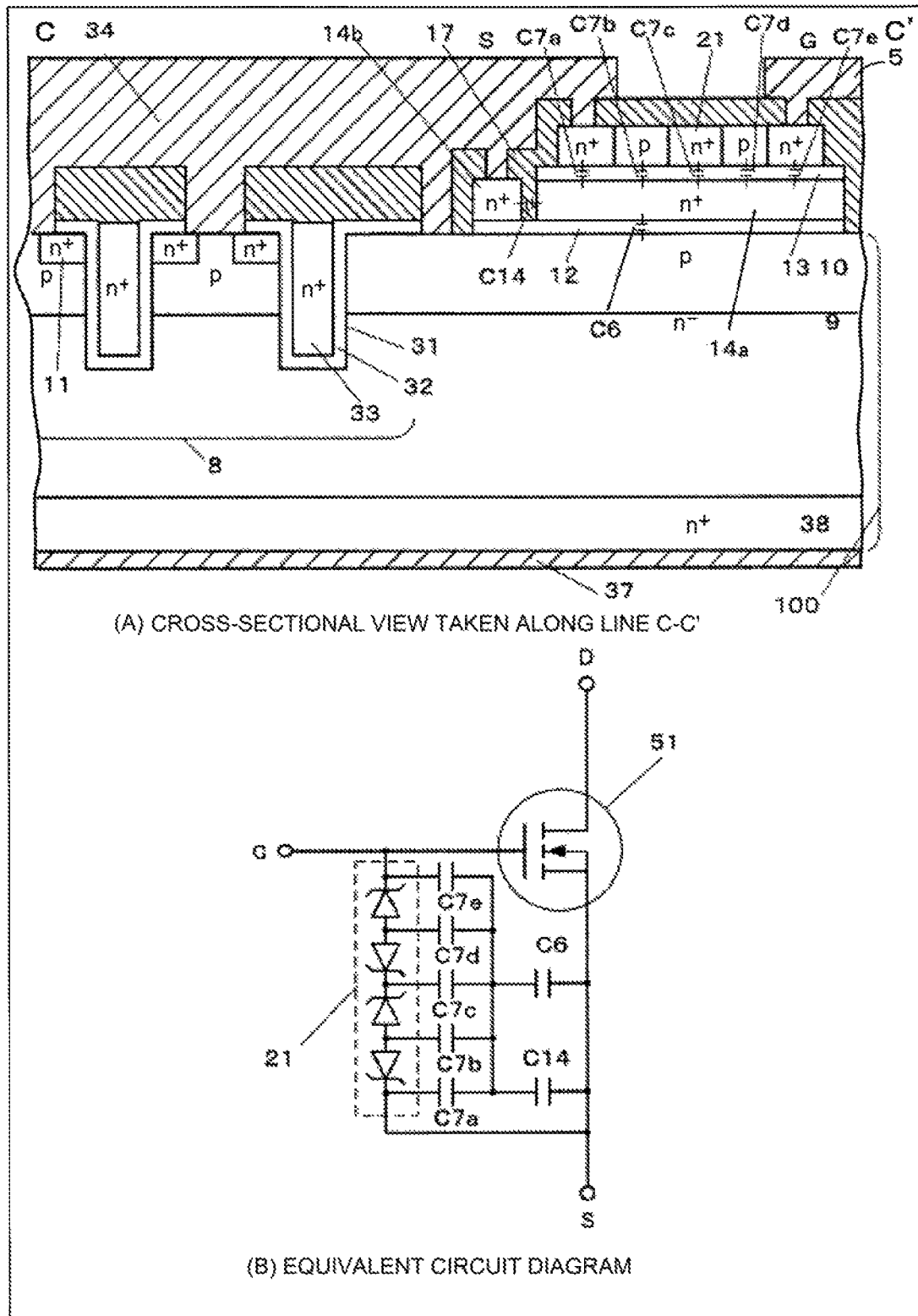
FIG. 11 is a diagram illustrating the structure of a semiconductor device according to Embodiment 7 of the invention.

A semiconductor device according to Embodiment 7 of the invention will be described. FIG. 11 is a diagram illustrating the structure of the semiconductor device according to Embodiment 7 of the invention. The semiconductor device according to Embodiment 7 is a modification of Embodiment 3. The planar structure of the semiconductor device according to Embodiment 7 is the same as the semiconductor device according to Embodiment 1 illustrated in FIG. 1. The semiconductor device according to Embodiment 7 differs from the semiconductor device according to Embodiment 3 in that a conductive layer 14 is divided into a conductive layer 14a, on which the protective diode 21 is arranged, and a conductive layer 14b, on which the protective diode 21 is not arranged, by a second insulating film 13 which passes through the conductive layer 14 in the thickness direction.

FIG. 11(A) is a cross-sectional view illustrating the cross-sectional structure of the semiconductor device according to Embodiment 7 taken along the cutting line C-C' of FIG. 1. FIG. 11(B) is an equivalent circuit diagram of FIG. 11(A). The conductive layer 14 is divided into the conductive layers 14a and 14b, as illustrated in FIG. 11. The second insulating film 13, which is an oxide film with a thickness that is equal to or greater than the thickness of a gate insulating film 32, is formed on the upper surface of the divided conductive layer 14a. The protective diode 21 is formed on the upper surface of the second insulating film 13. The conductive layer 14b is connected to a source electrode 34.

In this case, the conductive layer 14a is electrically insulated from a gate electrode 33, the source electrode 34, a drain electrode 35, an anode electrode, and a cathode electrode by an interlayer insulating film 17 and the second insulating film 13. It is possible to form a capacitor C14 which has the interlayer insulating film 17 between the conductive layer 14a and the conductive layer 14b as a capacitive component region.

As described above, according to Embodiment 7, the same effect as that in Embodiments 1 to 6 is obtained.

Embodiment 8

Figure 12:
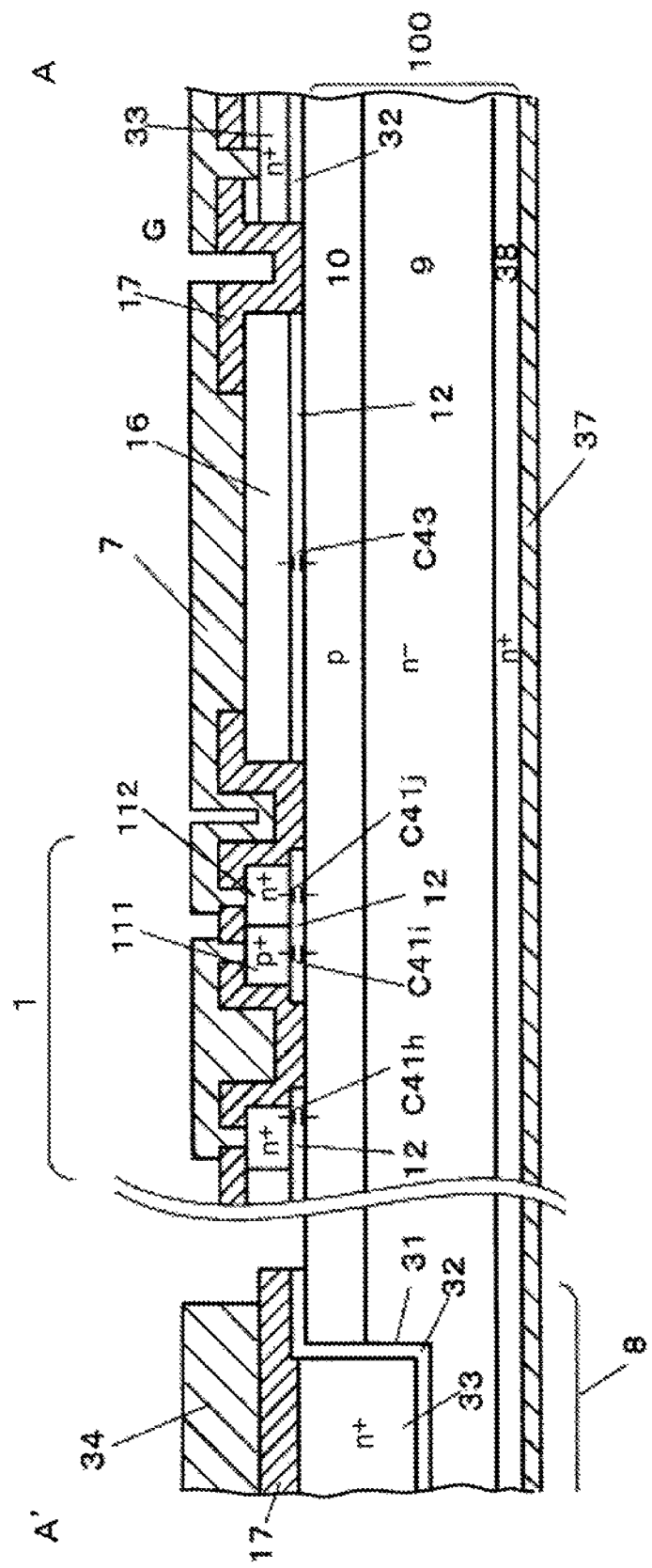
FIG. 12 is a cross-sectional view illustrating the structure of a semiconductor device according to Embodiment 8 of the invention.
Figure 13:
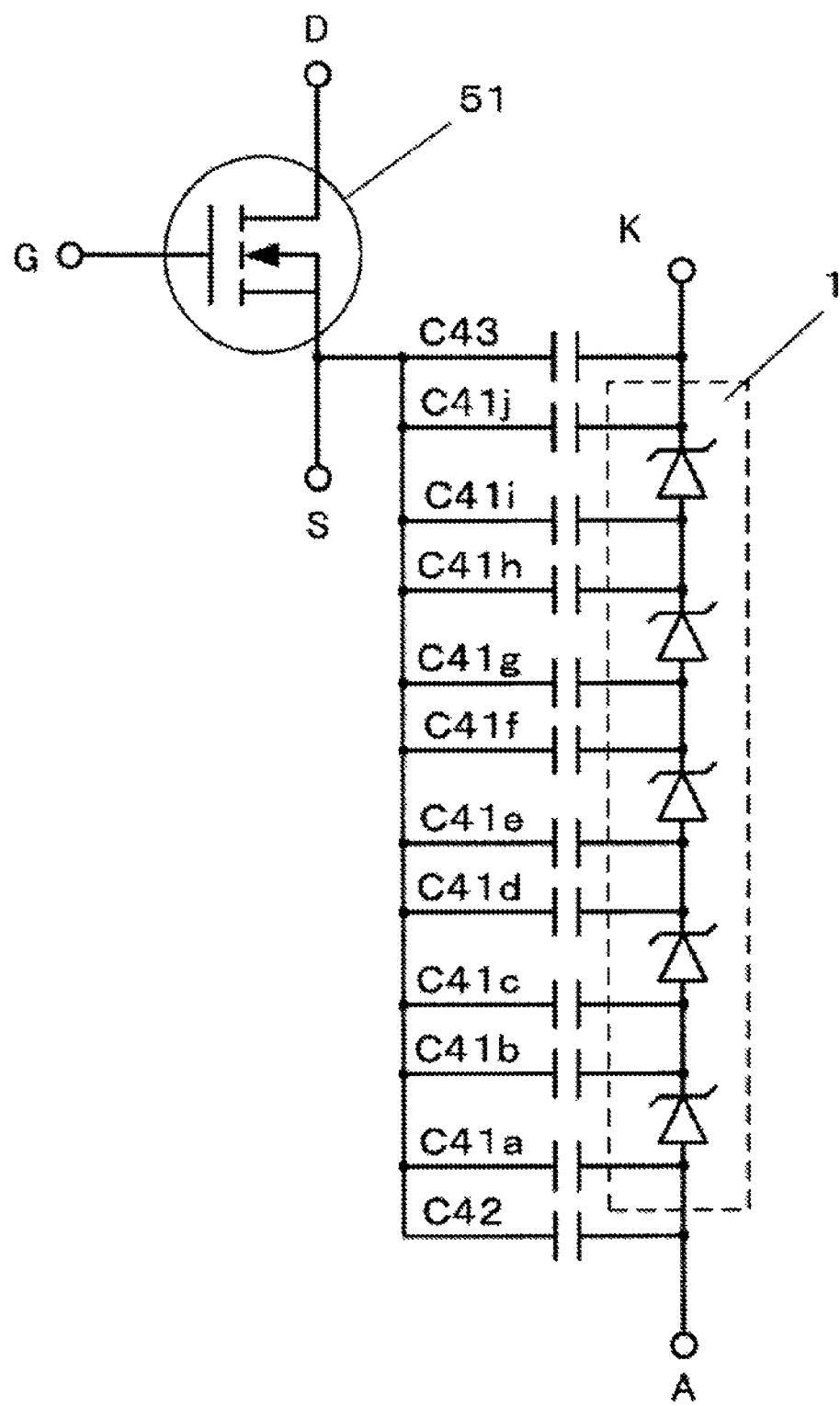
FIG. 13 is a circuit diagram illustrating the circuit structure of the semiconductor device according to Embodiment 8 of the invention.
Figure 14:
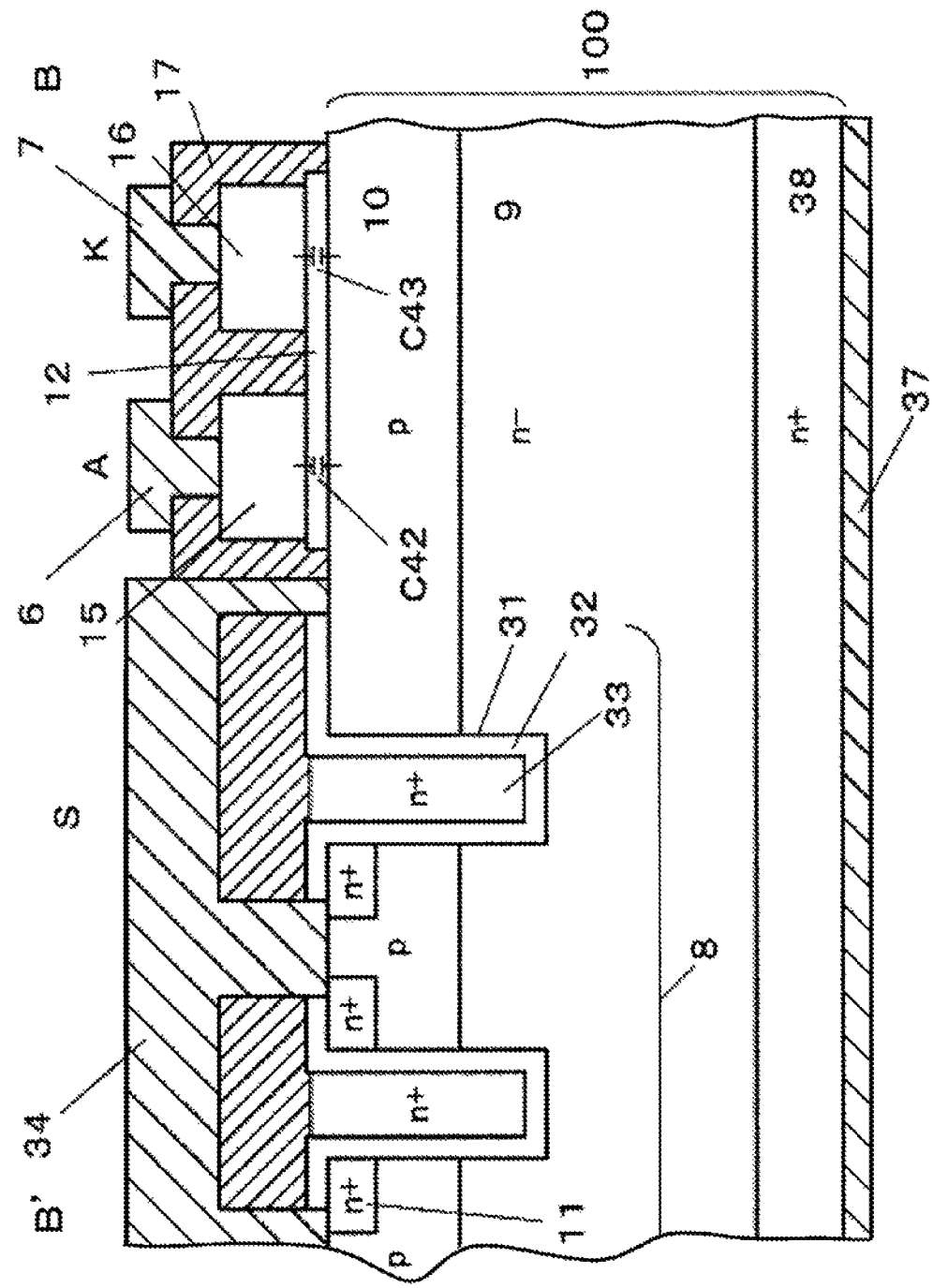
FIG. 14 is a cross-sectional view illustrating the structure of the semiconductor device according to Embodiment 8 of the invention.

A semiconductor device according to Embodiment 8 of the invention will be described. FIGS. 12 and 14 are cross-sectional views illustrating the structure of the semiconductor device according to Embodiment 8 of the invention. FIG. 13 is a circuit diagram illustrating the circuit structure of the semiconductor device according to Embodiment 8 of the invention. The planar structure of the semiconductor device according to Embodiment 8 is the same as the planar structure in Embodiment 1 illustrated in FIG. 1. FIG. 12 is a cross-sectional view illustrating the cross-sectional structure of the semiconductor device according to Embodiment 8 taken along the cutting line A-A' of FIG. 1. FIG. 13 is an equivalent circuit diagram of FIG. 12. FIG. 14 is a cross-sectional view illustrating the cross-sectional structure of the semiconductor device according to Embodiment 8 taken along the cutting line B-B' of FIG. 1. The semiconductor device according to Embodiment 8 of the invention differs from the semiconductor device according to Embodiment 2 of the invention in that a conductive layer 14 and a second insulating film 13 are not provided and a temperature detecting diode 1, an anode metal wiring line 6, and a cathode metal wiring line 7 are formed on the upper surface of a first insulating film 12.

As illustrated in FIGS. 12 to 14, in the semiconductor device according to Embodiment 8, an $n^-$ first semiconductor layer 9, which will be a drift region of a MOSFET 51, is formed on the first main surface side of a semiconductor substrate 100. A p-type first semiconductor region 10, which will be a base region of the MOSFET 51, is formed in a surface layer of the first semiconductor layer 9. An $n^+$ drain region 38 is formed on the second main surface side of the semiconductor substrate 100. A drain electrode 37 is formed on the surface of the drain region 38.

A trench 31 is formed in an active region 8 so as to extend from the first main surface of the semiconductor substrate 100 to the first semiconductor layer 9 through the first semiconductor region 10. A gate insulating film 32 is formed in the trench 31 along the inner wall of the trench 31. A gate electrode 33 is provided in the trench 31, with the gate insulating film 32 interposed therebetween. The gate insulating film 32 is an oxide film. The gate electrode 33 is covered with an interlayer insulating film 17 which is made of polysilicon doped with impurities. An $n^+$ second semiconductor region 11, which will be a source region, is formed adjacent to the side wall of the trench 31. A source electrode 34 comes into contact with the second semiconductor region 11 and the first semiconductor region 10.

The first insulating film 12 is formed on the first semiconductor region 10 below the temperature detecting diode 1. The temperature detecting diode 1 which is made of polysilicon is formed on the upper surface of the first insulating film 12. The first insulating film 12 is an oxide film. The thickness of the first insulating film 12 is equal to or greater than the thickness of the gate insulating film 32 in terms of voltage breakdown due to, for example, static electricity or overvoltage.

The temperature detecting diode 1 is formed by connecting a plurality of zener diodes, each having a $p^+$ layer 111 and an $n^+$ layer 112, in series to each other. The $p^+$ layer 111 is made of polysilicon doped with, for example, boron. The $n^+$ layer 112 is made of polysilicon doped with, for example, arsenic or phosphorus.

Below the anode metal wiring line 6 which connects the temperature detecting diode 1 and an anode electrode pad 3, the first insulating film 12, which is an oxide film with a thickness that is equal to or greater than the thickness of the gate insulating film 32, is formed on the first semiconductor region 10. A first semiconductor layer 15 is formed on the upper surface of the first insulating film 12.

Below the cathode metal wiring line 7 which connects the temperature detecting diode 1 and a cathode electrode pad 4, the first insulating film 12, which is an oxide film with a thickness that is equal to or greater than the thickness of the gate insulating film 32, is formed on the first semiconductor region 10. A second semiconductor layer 16 is formed on the upper surface of the first insulating film 12.

The first semiconductor layer 15 and the second semiconductor layer 16 are made of polysilicon doped with impurities. The thickness of the first semiconductor layer 15 and the second semiconductor layer 16 is in the range of, for example, about 0.5 μm to 1 μm. The formation of polysilicon, ion implantation, and thermal diffusion for forming the first semiconductor layer 15 and the second semiconductor layer 16 are performed in the same step as the formation of the temperature detecting diode 1. The conductivity type of the first semiconductor layer 15 and the second semiconductor layer 16 may be a p type or an n type. When polysilicon is, for example, a p type, boron can be used as the impurities added to polysilicon. When polysilicon is an n type, arsenic or phosphorus can be used as the impurities.

The first semiconductor layer 15 below the anode metal wiring line 6 and the second semiconductor layer 16 below the cathode metal wiring line 7 are formed on the same first semiconductor region 10 and the same first insulating film 12. In addition, the temperature detecting diode 1, the first semiconductor layer 15 below the anode metal wiring line 6, and the second semiconductor layer 16 below the cathode metal wiring line 7 are formed on the same first semiconductor region 10 and the same first insulating film 12.

As such, since the first insulating film 12 is formed on the first semiconductor region 10 and the temperature detecting diode 1 is provided on the upper surface of the first insulating film 12, it is possible to form a capacitor C41 (C41a to C41j), which has the first insulating film 12 between the first semiconductor region 10 and the temperature detecting diode 1 as a capacitive component region, below the temperature detecting diode 1.

Since the first insulating film 12 is formed on the first semiconductor region 10 and the first semiconductor layer 15 is provided on the upper layer of the first insulating film 12, it is possible to form a capacitor C42, which has the first insulating film 12 between the first semiconductor region 10 and the first semiconductor layer 15 as a capacitive component region, below the anode metal wiring line 6.

Since the first insulating film 12 is formed on the first semiconductor region 10 and the second semiconductor layer 16 is provided on the upper layer of the first insulating film 12, it is possible to form a capacitor C43, which has the first insulating film 12 between the first semiconductor region 10 and the second semiconductor layer 16 as a capacitive component region, below the cathode metal wiring line 7.

In order to use the first insulating film 12 as the capacitive component region, the anode metal wiring line 6 and the cathode metal wiring line 7 can be directly formed on the first insulating film 12, without forming the first semiconductor layer 15 and the second semiconductor layer 16. However, this structure is not preferable for the following reason. Before the anode metal wiring line 6 and the cathode metal wiring line 7 are formed, a step of covering the first main surface of the semiconductor substrate 100 with the interlayer insulating film 17 and etching the interlayer insulating film 17 is performed. When the first semiconductor layer 15 and the second semiconductor layer 16 are not formed on the upper surface of the first insulating film 12, etching residue or damage occurs in the surface of the first insulating film 12 due to the step of etching the interlayer insulating film 17. As a result, a variation in the thickness of the first insulating film 12 occurs and a variation in the capacitive component region occurs.

Therefore, when the first semiconductor layer 15 and the second semiconductor layer 16 are formed on the upper surface of the first insulating film 12, it is possible to form the capacitor C42 and the capacitor C43 having the stable capacitive component region, without being affected by the etching of the interlayer insulating film 17.

The thickness of the first insulating film 12 can be changed to adjust the capacitance of the capacitor C41, the capacitor C42, and the capacitor C43, each having the first insulating film 12 as the capacitive component region, to necessary static electricity resistance.

For example, when the temperature detecting diode 1 has an electrostatic breakdown voltage of about 200 V, a capacitance of about 90 pF is required. Therefore, the thickness of the first insulating film 12 may be equal to or greater than the thickness of the gate insulating film 32 and equal to or less than 1000 Å.

As described above, according to Embodiment 8, since the capacitive component region is formed between the temperature detecting diode 1 and the first semiconductor region 10 below the temperature detecting diode 1, it is possible to improve the static electricity resistance of the temperature detecting diode 1, without increasing the area of the temperature detecting diode 1.

According to Embodiment 8, since the capacitive component region is formed between the first semiconductor region 10 below the anode metal wiring line 6 and the cathode metal wiring line 7 and the first and second semiconductor layers 15 and 16, it is possible to improve the static electricity resistance of the temperature detecting diode 1, without reducing the area of the active region 8.

Embodiment 9

Figure 15:
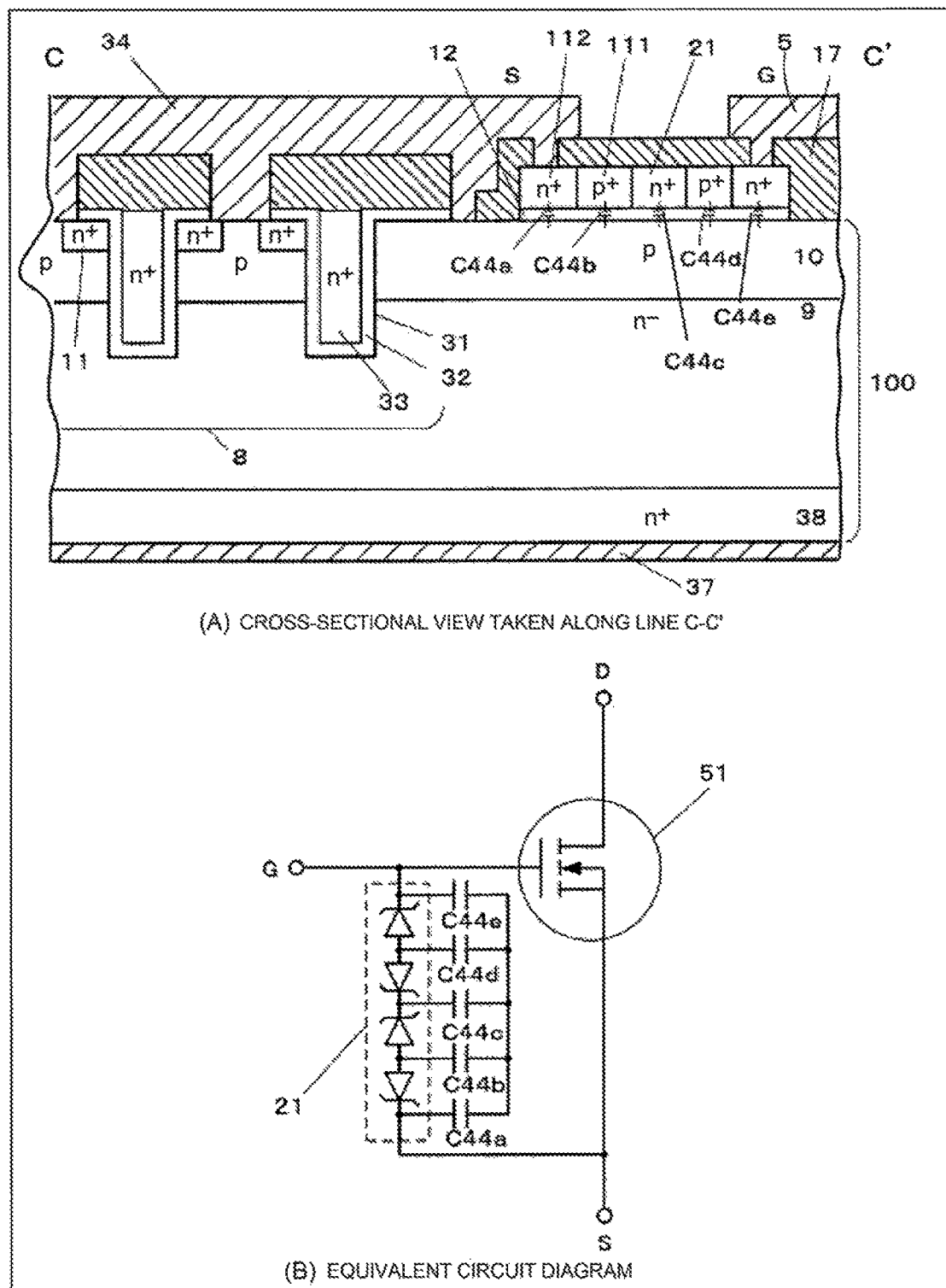
FIG. 15 is a diagram illustrating the structure of a semiconductor device according to Embodiment 9 of the invention.

A semiconductor device according to Embodiment 9 will be described. FIG. 15 is a diagram illustrating the structure of the semiconductor device according to Embodiment 9 of the invention. The planar structure of the semiconductor device according to Embodiment 9 is the same as the planar structure in the Embodiment 1 illustrated in FIG. 1. FIG. 15(A) is a cross-sectional view illustrating the cross-sectional structure of the semiconductor device according to Embodiment 9 taken along the cutting line C-C' of FIG. 1. FIG. 15(B) is an equivalent circuit diagram of FIG. 15(A). The semiconductor device according to Embodiment 9 of the invention differs from the semiconductor device according to Embodiment 3 in that a conductive layer 14 and a second insulating film 13 are not provided and a protective diode 21 is formed on the upper surface of a first insulating film 12.

As illustrated in FIG. 15, in the semiconductor device according to Embodiment 9, an $n^-$ first semiconductor layer 9, which will be a drift region of a MOSFET 51, is formed on the first main surface side of a semiconductor substrate 100. A p-type first semiconductor region 10, which will be a base region of the MOSFET 51, is formed in a surface layer of the first semiconductor layer 9. An $n^+$ drain region 38 is formed on the second main surface side of the semiconductor substrate 100. A drain electrode 37 is formed on the surface of the drain region 38.

A trench 31 is formed in an active region 8 so as to extend from the first main surface of the semiconductor substrate 100 to the first semiconductor layer 9 through the first semiconductor region 10. A gate insulating film 32 is formed in the trench 31 along the inner wall of the trench 31. A gate electrode 33 is provided in the trench 31, with the gate insulating film 32 interposed therebetween. The gate insulating film 32 is an oxide film. The gate electrode 33 is covered with an interlayer insulating film 17 which is made of polysilicon doped with impurities. An $n^+$ second semiconductor region 11, which will be a source region, is formed adjacent to the side wall of the trench 31. A source electrode 34 comes into contact with the second semiconductor region 11 and the first semiconductor region 10.

The protective diode 21 is arranged between the source electrode 34 and the gate electrode pad 5. Below the protective diode 21, the first insulating film 12 is formed on the first semiconductor region 10. The first insulating film 12 is an oxide film. The thickness of the first insulating film 12 is equal to or greater than the thickness of the gate insulating film 32 in terms of voltage breakdown due to, for example, static electricity or overvoltage. The protective diode 21 which is made of polysilicon is formed on the upper surface of the first insulating film 12. The protective diode 21 is connected to between a gate G and a source S.

The protective diode 21 provided between the gate G and the source S is a multi-stage bidirectional zener diode including a $p^+$ layer 111 and a $n^+$ layer 112. The $p^+$ layer 111 is made of polysilicon doped with, for example, boron. The $n^+$ layer 112 is made of polysilicon doped with, for example, arsenic or phosphorus.

As such, since the first insulating film 12 is formed on the first semiconductor region 10 and the protective diode 21 is provided on the upper surface of the first insulating film 12, it is possible to form a capacitor C44 (C44a to C44e), which has the first insulating film 12 between the first semiconductor region 10 and the protective diode 21 as a capacitive component region, below the protective diode 21 provided between the gate G and the source S.

The thickness of the first insulating film 12 can be changed to adjust the capacitance of the capacitor C44 having the first insulating film 12 as the capacitive component region to necessary static electricity resistance. For example, when the protective diode 21 has an electrostatic breakdown voltage of about 200 V, a capacitance of about 90 pF is required. Therefore, that the thickness of the first insulating film 12 may be equal to or greater than the thickness of the gate insulating film 32 and equal to or less than 1000 Å.

As described above, according to Embodiment 9, since the capacitive component region is formed between the first semiconductor region 10 and the protective diode 21 below the protective diode 21 provided between the gate G and the source S, it is possible to improve the static electricity resistance of the protective diode 21, without increasing the area of the protective diode 21.

Embodiment 10

Figure 16:
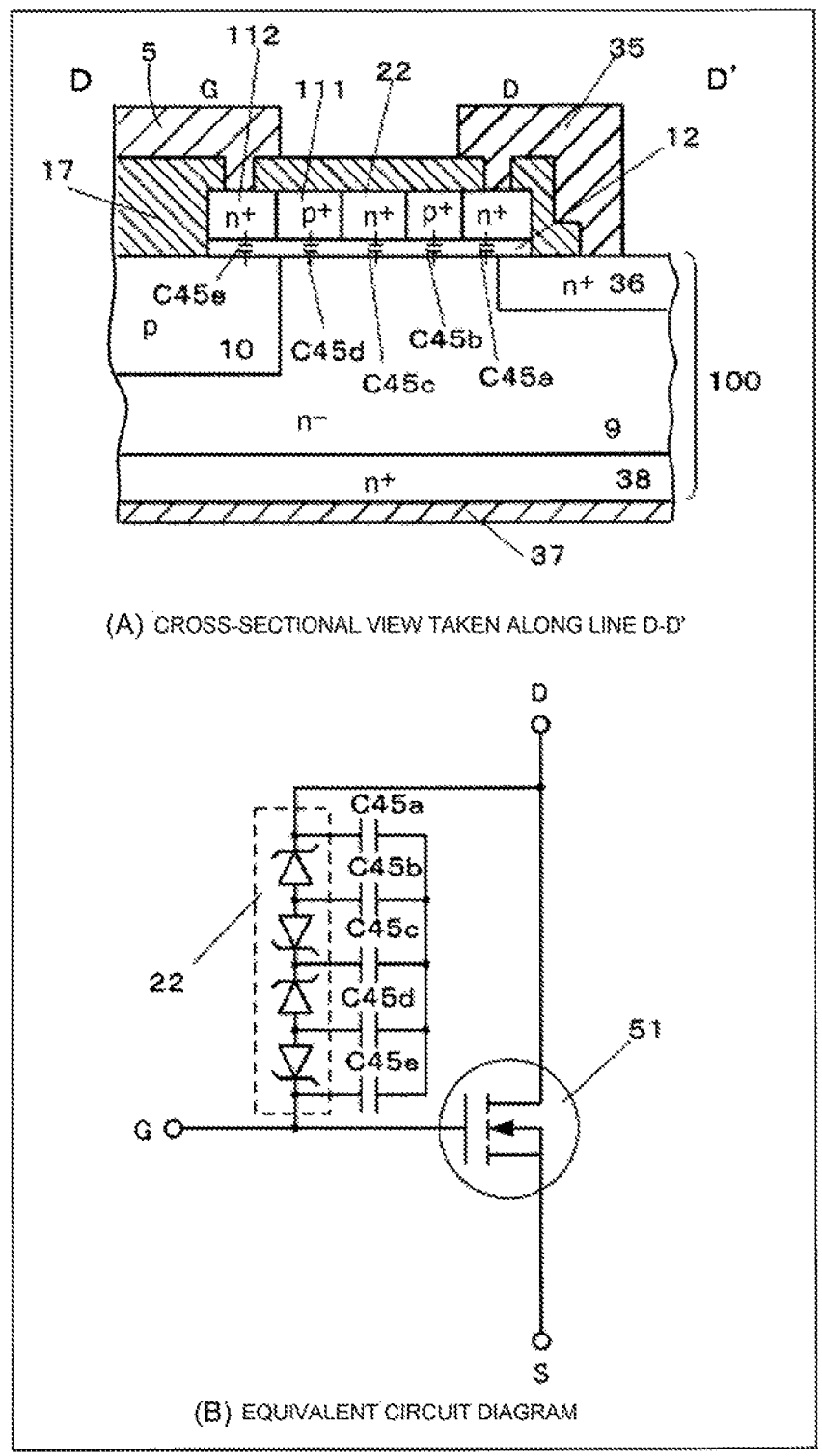
FIG. 16 is a diagram illustrating the structure of a semiconductor device according to Embodiment 10 of the invention.

A semiconductor device according to Embodiment 10 of the invention will be described. FIG. 16 is a diagram illustrating the structure of the semiconductor device according to Embodiment 10 of the invention. The planar structure of the semiconductor device according to Embodiment 10 is the same as the planar structure in Embodiment 1 illustrated in FIG. 1. FIG. 16(A) is a cross-sectional view illustrating the cross-sectional structure of the semiconductor device according to Embodiment 10 taken along the cutting line D-D' of FIG. 1. FIG. 16(B) is an equivalent circuit diagram of FIG. 16(A). The semiconductor device according to Embodiment 10 of the invention differs from the semiconductor device according to Embodiment 4 in that a conductive layer 14 and a second insulating film 13 are not provided and a protective diode 22 is formed on the upper surface of a first insulating film 12.

As illustrated in FIG. 16, in the semiconductor device according to Embodiment 10, an $n^-$ first semiconductor layer 9, which will be a drift region of a MOSFET 51, is formed on the first main surface side of a semiconductor substrate 100. A p-type first semiconductor region 10, which will be a base region of the MOSFET 51, is formed in the first semiconductor layer 9 close to the gate electrode pad 5. An $n^+$ drain region 36 is formed in a surface layer of the first semiconductor layer 9 which is close to a drain electrode 35. A drain region 38 is formed on the second main surface side of the semiconductor substrate 100. A drain electrode 37 is formed on the surface of the drain region 38.

The protective diode 22 is arranged between a gate electrode pad 5 and the drain electrode 35. The first insulating film 12 is formed on the first main surface of the semiconductor substrate 100 so as to extend over the first semiconductor region 10 close to the gate electrode pad 5 and the drain region 36 close to the drain electrode 35. A protective diode 22 which is made of polysilicon is formed on the upper surface of the first insulating film 12. The protective diode 22 is connected between a gate G and a drain D. The first insulating film 12 is an oxide film. The thickness of the first insulating film 12 is equal to or greater than the thickness of the gate insulating film 32 in terms of voltage breakdown due to, for example, static electricity or overvoltage.

The protective diode 22 connected between the gate G and the drain D is a multi-stage bidirectional zener diode including a $p^+$ layer 111 and an $n^+$ layer 112. The $p^+$ layer 111 is made of polysilicon doped with, for example, boron. The $n^+$ layer 112 is made of polysilicon doped with, for example, arsenic or phosphorus.

As such, the first insulating film 12 is formed on the first semiconductor region 10 and the protective diode 22 is provided on the upper surface of the first insulating film 12. Therefore, it is possible to form a capacitor C45 (C45a to C45e), which has the first insulating film 12 between the semiconductor substrate 100 and the protective diode 22 as a capacitive component region, below the protective diode 22 provided between the gate G and the drain D.

The thickness of the first insulating film 12 can be changed to adjust the capacitance of the capacitor C45, which has the first insulating film 12 as the capacitive component region, to necessary static electricity resistance. For example, when the protective diode 22 has an electrostatic breakdown voltage of about 200 V, a capacitance of about 90 pF is required. Therefore, the thickness of the first insulating film 12 may be equal to or greater than the thickness of the gate insulating film 32 and equal to or less than 1000 Å.

As described above, according to Embodiment 10, the capacitive component region is formed between the semiconductor substrate 100, which is arranged below the protective diode 22 provided between the gate G and the drain D, and the protective diode 22. Therefore, it is possible to improve the static electricity resistance of the protective diode 22, without increasing the area of the protective diode 22.

Embodiment 11

Figure 17:
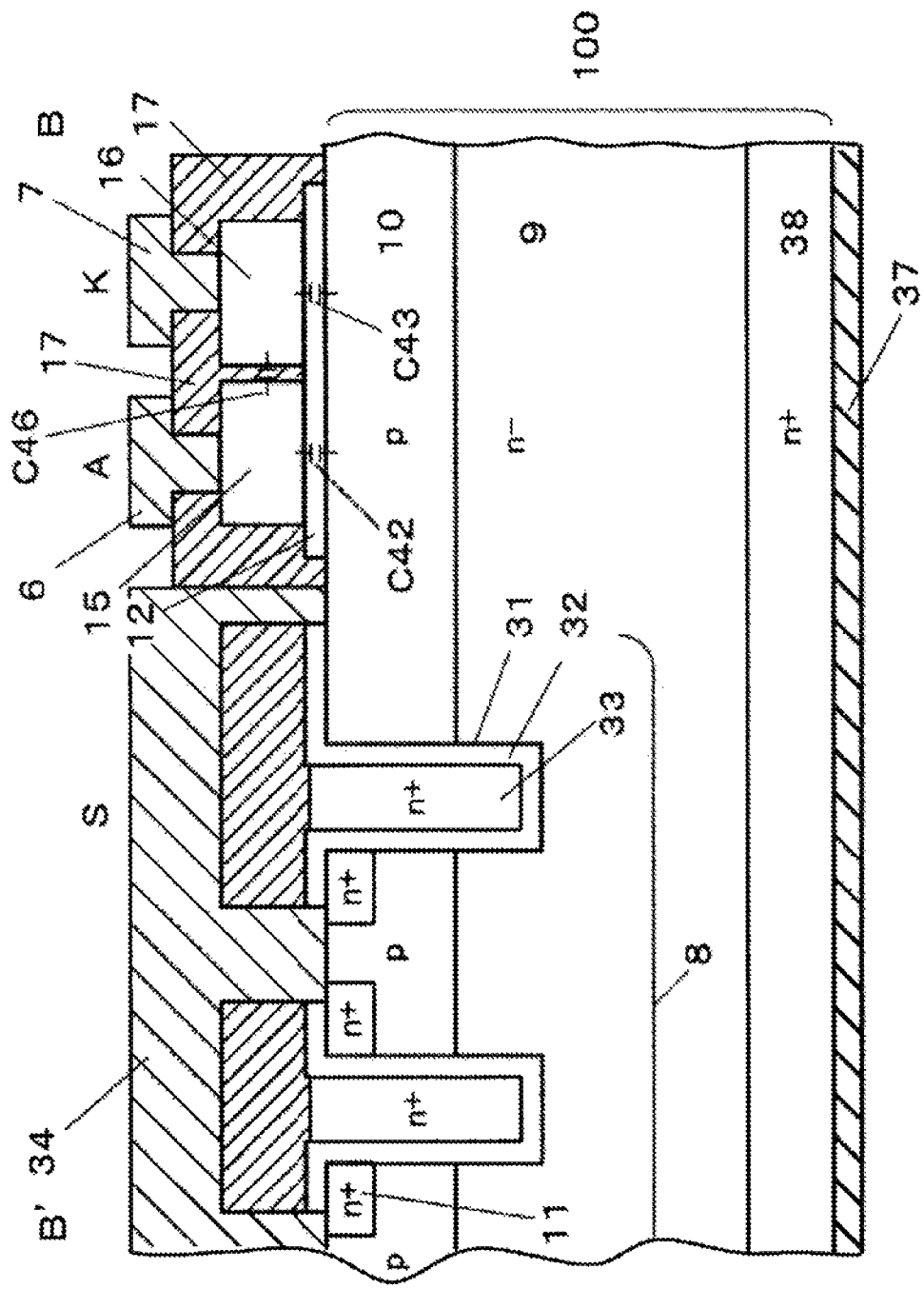
FIG. 17 is a cross-sectional view illustrating the structure of a semiconductor device according to Embodiment 11 of the invention.

A semiconductor device according to Embodiment 11 of the invention will be described. FIG. 17 is a cross-sectional view illustrating the structure of the semiconductor device according to Embodiment 11 of the invention. The planar structure of the semiconductor device according to Embodiment 11 is the same as the planar structure in Embodiment 1 illustrated in FIG. 1. FIG. 17 illustrates the cross-sectional structure of the semiconductor device according to Embodiment 11 taken along the cutting line B-B' of FIG. 1. The semiconductor device according to Embodiment 11 is a modification of the semiconductor device according to Embodiment 8. The semiconductor device according to Embodiment 11 differs from the semiconductor device according to Embodiment 8 in that a portion of an interlayer insulating film 17 interposed between a first semiconductor layer 15 and a second semiconductor layer 16 is a capacitive component region.

As illustrated in FIG. 17, the gap between the first semiconductor layer 15 below an anode metal wiring line 6 and the second semiconductor layer 16 below a cathode metal wiring line 7 is narrowed to form a capacitor C46 which has the interlayer insulating film 17 provided between the first semiconductor layer 15 and the second semiconductor layer 16 as the capacitive component region. The gap between the first semiconductor layer 15 and the second semiconductor layer 16 may be, for example, about 0.5

As described above, according to Embodiment 11, it is possible to form a capacitive component region below the anode metal wiring line 6 and the cathode metal wiring line 7 which are provided from a temperature detecting diode 1 to an anode electrode pad 3 and a cathode electrode pad 4, without reducing the area of an active region 8. Therefore, it is possible to improve the static electricity resistance of the temperature detecting diode 1.

Embodiment 12

Figure 18:
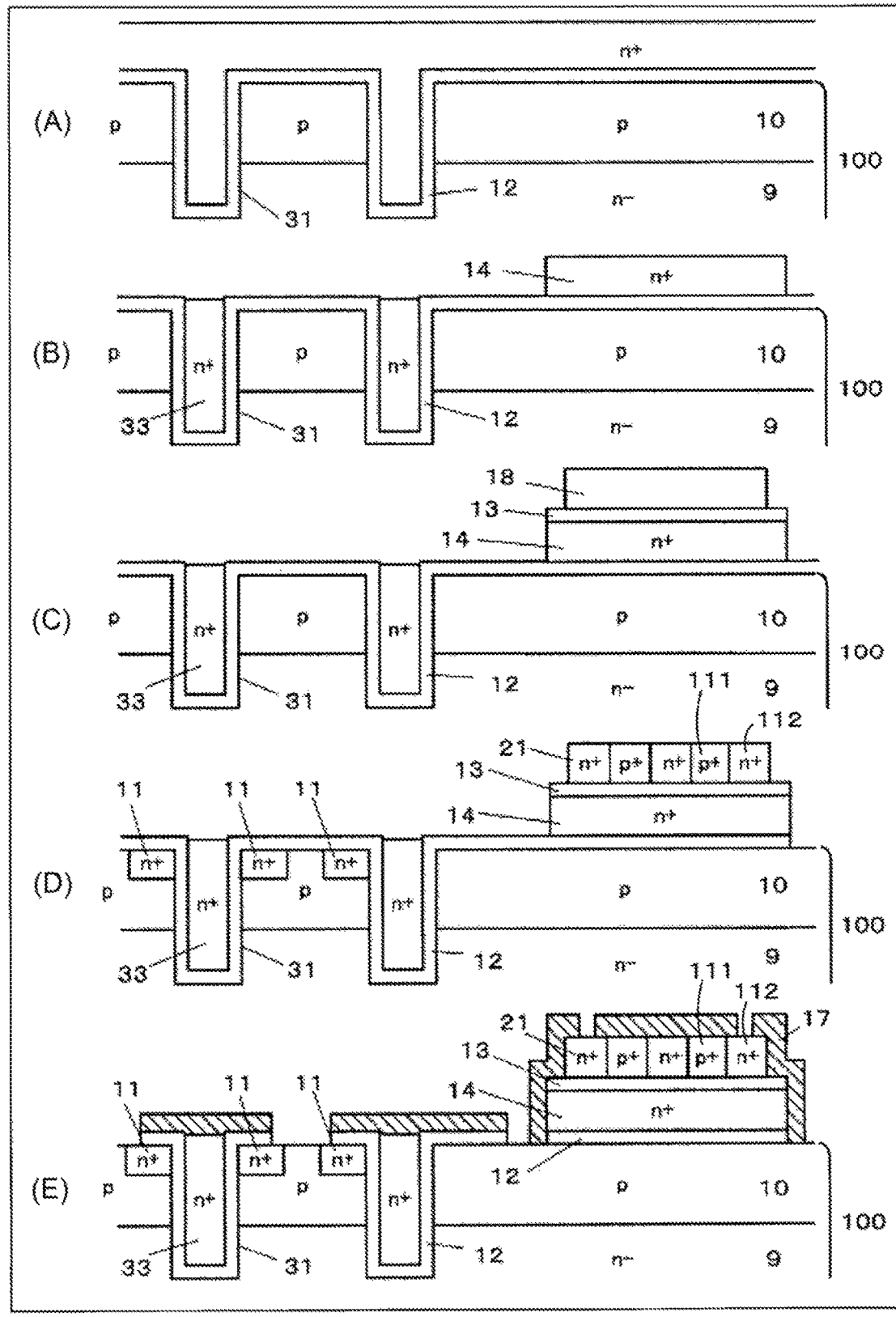
FIG. 18 is a cross-sectional view illustrating a method for producing a semiconductor device according to Embodiment 12 of the invention.

A method for producing a semiconductor device according to Embodiment 12 of the invention will be described. FIG. 18 is a cross-sectional view illustrating the method for producing the semiconductor device according to Embodiment 12 of the invention. A method for producing the protective diode 21 between the gate G and the source S according to Embodiment 3 will be described as an example of Embodiment 12.

First, as illustrated in FIG. 18(A), the trench 31 is formed in the semiconductor substrate 100, in which the first semiconductor region 10 is formed in the surface layer of the first semiconductor layer 9 by diffusion, so as to extend from the first main surface of the semiconductor substrate 100 to the first semiconductor layer 9 through the first semiconductor region 10. Then, the first insulating film 12 is formed on the surface of the semiconductor substrate 100 (the first main surface of the semiconductor substrate 100 and the inner wall of the trench 31) by thermal oxidation. The first insulating film 12 which is formed along the inner wall of the trench 31 is the gate insulating film 32. That is, the first insulating film 12 is formed in the same step as the gate insulating film 32.

Then, polysilicon for forming the conductive layer 14 is deposited on the first insulating film 12 by a chemical vapor deposition (CVD) method while being doped with n-type impurities. The impurity concentration of the conductive layer 14 is in the range of, for example, $4 \times 10^{20}$ cm$^{-3}$ to $5 \times 10^{20}$ cm$^{-3}$. In this case, the conductive layer 14 provided in the trench 31 is the gate electrode 33. That is, the conductive layer 14 is formed in the same step as polysilicon for forming the gate electrode 33 is deposited.

Then, as illustrated in FIG. 18(B), the conductive layer 14 is patterned and the gate electrode 33 is formed in the trench 31. In addition, the conductive layer 14 is formed on the first insulating film 12. In this case, the thickness of the conductive layer 14 is, for example, 0.5

Then, as illustrated in FIG. 18(C), the second insulating film 13 is formed with a thickness that is equal to or greater than the thickness of the gate insulating film 32 on the entire surface of the conductive layer 14 by thermal oxidation or the CVD method. The thickness of the second insulating film 13 may be equal to or greater than the thickness of the gate insulating film 32 and equal to or less than 1000 Å. Then, a semiconductor layer 18 which is made of undoped polysilicon for forming the protective diode 21 is formed with a thickness of, for example, 0.5 µm to 1 µm on the second insulating film 13 by the CVD method and is then patterned.

Then, as illustrated in FIG. 18(D), p-type impurity ions and n-type impurity ions are selectively implanted into the semiconductor layer 18 in this order and an activation process is performed to form the protective diode 21 including the p$^+$ layer 111 and the n$^+$ layer 112. The p-type impurity ions and the n-type impurity ions are sequentially implanted using a mask obtained by patterning a resist (not illustrated) formed on the semiconductor layer 18 in a predetermined pattern. At the same time as the n-type impurity ions are implanted, the n-type impurity ions are implanted into the first semiconductor region 10 in the active region 8 to form the second semiconductor region 11 in the surface layer of the first semiconductor region 10.

In the implantation of the n-type ions, for example, arsenic is used as a dopant and impurity concentration is in the range of, for example, about $0.5 \times 10^{20}$ cm$^{-3}$ to $2.5 \times 10^{20}$ cm$^{-3}$. In the implantation of the p-type ions, for example, boron is used as the dopant and impurity concentration is in the range of, for example, about $0.5 \times 10^{20}$ cm$^{-3}$ to $2.5 \times 10^{20}$ cm$^{-3}$. The impurity concentration of the second semiconductor region 11 is in the range of, for example, about $0.5 \times 10^{20}$ cm$^{-3}$ to $2.5 \times 10^{20}$ cm$^{-3}$ and, for example, arsenic is used as the dopant.

In addition, phosphorus may be used instead of arsenic which is implanted in the ion implantation. Then, as illustrated in FIG. 18(E), the interlayer insulating film 17 is formed on the first main surface of the semiconductor substrate 100 and is then patterned. In this case, the conductive layer 14 is electrically insulated from the gate electrode 33 or each electrode which is formed in the subsequent steps by the interlayer insulating film 17 and the second insulating film 13. Then, the other element structures are formed on the first main surface side of the semiconductor substrate 100 by a general method and a drain region or a drain electrode is formed on the second main surface side of the semiconductor substrate 100. In this way, the semiconductor device illustrated in FIG. 5 is completed.

As an example of the method for producing the semiconductor device according to Embodiment 12, a method for producing the protective diode 21 has been described. However, the invention can also be applied to a method for producing the temperature detecting diode 1 and a method for producing the protective diode 22 between the gate G and the drain D.

As described above, according to Embodiment 12, the first insulating film 12 is used as the gate insulating film 32 and polysilicon for forming the gate electrode 33 is used as the conductive layer 14. Therefore, it is possible to reduce the number of production steps.

Embodiment 13

Figure 19:
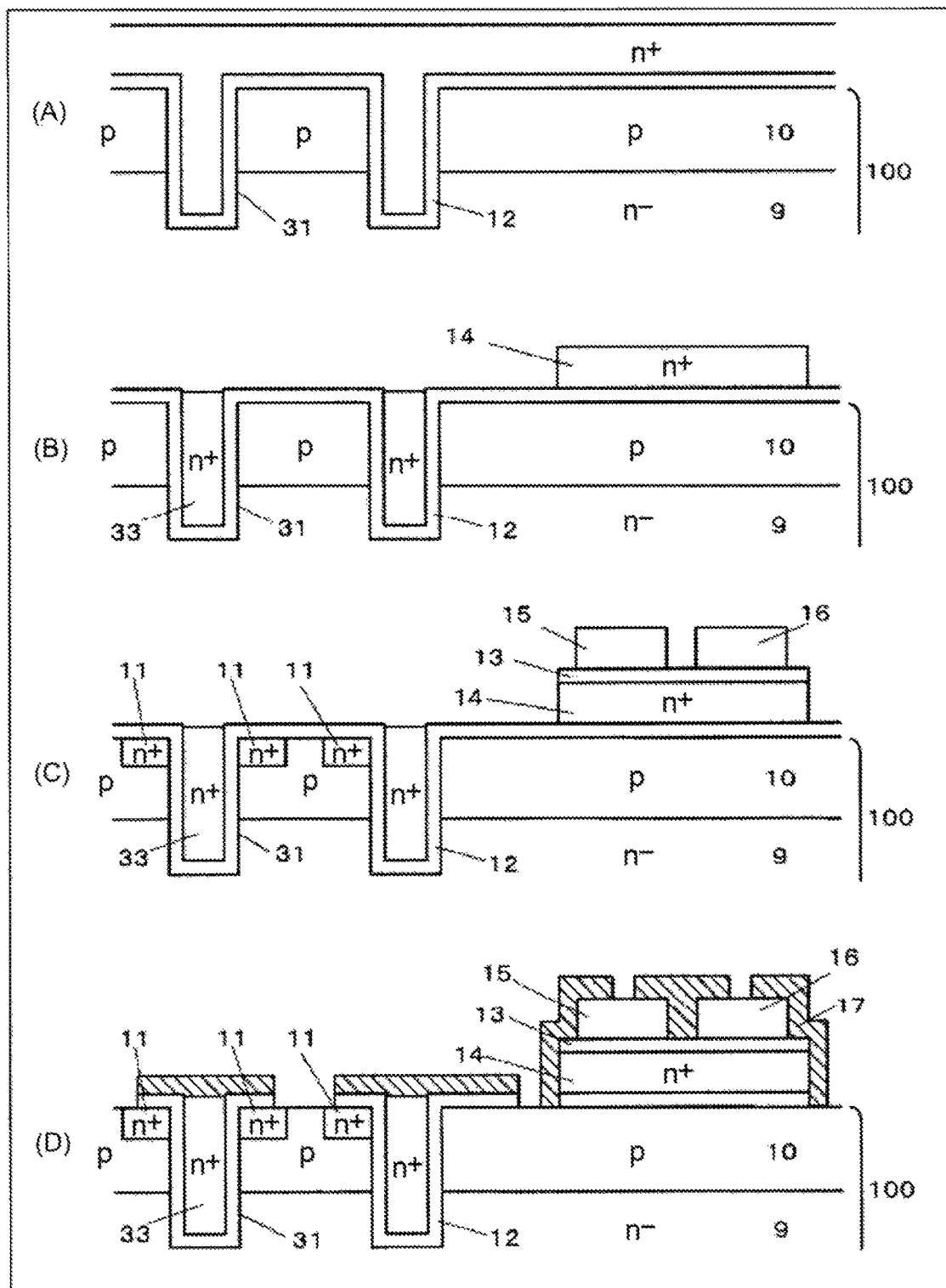
FIG. 19 is a cross-sectional view illustrating a method for producing a semiconductor device according to Embodiment 13 of the invention.
Figure 20:
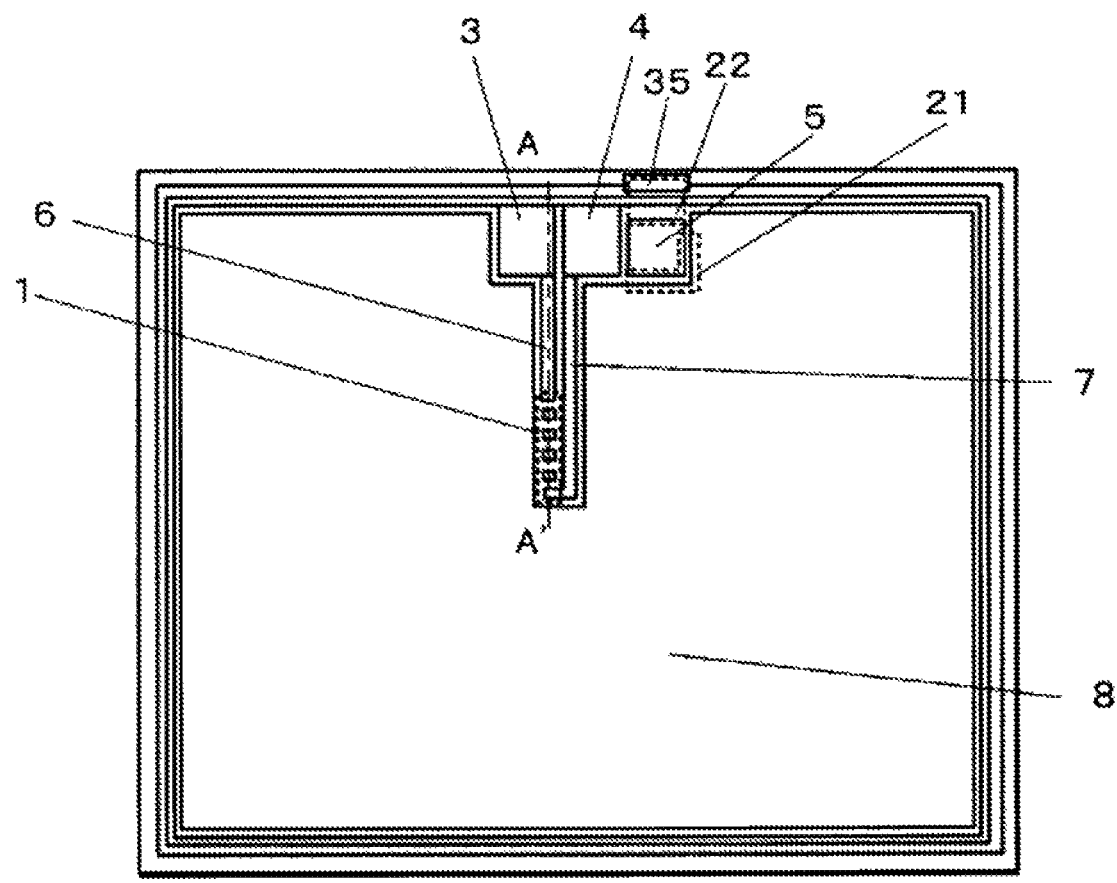
FIG. 20 is a plan view illustrating the structure of a MOS semiconductor device according to the related art.
Figure 21:
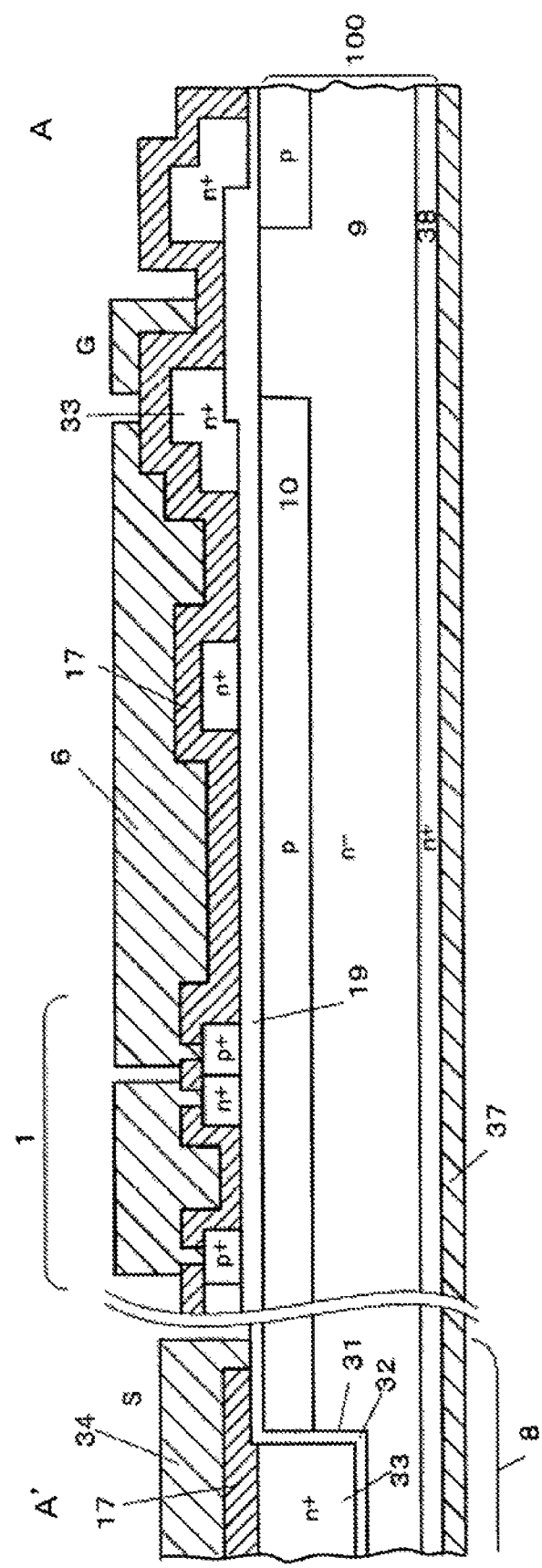
FIG. 21 is a cross-sectional view illustrating a cross-sectional structure taken along the cutting line A-A' of FIG. 20.

FIG. 19 is a cross-sectional view illustrating a method for producing a semiconductor device according to Embodiment 13 of the invention. A method for producing a portion below the anode metal wiring line 6 and the cathode metal wiring line 7 which connect the temperature detecting diode 1 and the anode and cathode electrode pads 3 and 4 in Embodiment 2 will be described as an example of Embodiment 13.

First, as illustrated in FIG. 19(A), the trench 31 is formed in the semiconductor substrate 100, in which the first semiconductor region 10 is formed in the surface layer of the first semiconductor layer 9 by diffusion, so as to extend from the first main surface of the semiconductor substrate 100 to the first semiconductor layer 9 through the first semiconductor region 10. Then, the first insulating film 12 is formed on the surface of the semiconductor substrate 100 (the first main surface of the semiconductor substrate 100 and the inner wall of the trench 31) by thermal oxidation. The first insulating film 12 which is formed along the inner wall of the trench 31 is the gate insulating film 32. That is, the first insulating film 12 is formed in the same step as the gate insulating film 32.

Then, polysilicon for forming the conductive layer 14 is deposited on the first insulating film 12 by a CVD method while being doped with n-type impurities. The impurity concentration of the conductive layer 14 is in the range of, for example, $4 \times 10^{20}$ cm$^{-3}$ to $5 \times 10^{20}$ cm$^{-3}$. In this case, the conductive layer 14 provided in the trench 31 is the gate electrode 33. That is, the conductive layer 14 is formed in the same step as polysilicon for forming the gate electrode 33 is deposited.

Then, as illustrated in FIG. 19(B), the conductive layer 14 is patterned and the gate electrode 33 is formed in the trench 31. In addition, the conductive layer 14 is formed on the first insulating film 12. In this case, the thickness of the conductive layer 14 is in the range of, for example, 0.5 µm to 1 µm.

Then, as illustrated in FIG. 19(C), the second insulating film 13 is formed with a thickness that is equal to or greater than the thickness of the gate insulating film 32 on the entire surface of the conductive layer 14 by thermal oxidation or the CVD method. The thickness of the second insulating film 13 may be equal to or greater than the thickness of the gate insulating film 32 and equal to or less than 1000 Å. Then, a semiconductor layer 18 which is made of undoped polysilicon for forming the first semiconductor layer 15 and the second semiconductor layer 16 is formed on the second insulating film 13 by the CVD method and is then patterned. The thickness of the first semiconductor layer 15 and the second semiconductor layer 16 is in the range of, for example, 0.5 µm to 1 µm.

In addition, p-type impurity ions and n-type impurity ions are selectively implanted into the semiconductor layer in this order and an activation process is performed such that the first semiconductor layer 15 and the second semiconductor layer 16 have predetermined conductivity types. The p-type impurity ions and the n-type impurity ions for forming the first semiconductor layer 15 and the second semiconductor layer 16 are sequentially implanted using a mask obtained by patterning a resist (not illustrated) formed on the undoped semiconductor layer in a predetermined pattern. At the same time as the n-type impurity ions are implanted, the n-type impurity ions are implanted into the first semiconductor region 10 in the active region 8 to form the second semiconductor region 11 in the surface layer of the first semiconductor region 10.

In the implantation of the n-type ions, for example, arsenic is used as a dopant and impurity concentration is in the range of, for example, about $0.5 \times 10^{20}$ cm$^{-3}$ to $2.5 \times 10^{20}$ cm$^{-3}$. In the implantation of the p-type ions, for example, boron is used as the dopant and impurity concentration is in the range of, for example, about $0.5 \times 10^{20}$ cm$^{-3}$ to $2.5 \times 10^{20}$ cm$^{-3}$.

In addition, phosphorus may be used instead of arsenic which is implanted in the ion implantation. Then, as illustrated in FIG. 19(D), the interlayer insulating film 17 is formed on the first main surface of the semiconductor substrate 100 and is then patterned. In this case, the conductive layer 14 is electrically insulated from the gate electrode 33 or each electrode which is formed in the subsequent steps by the interlayer insulating film 17 and the second insulating film. Then, the other element structures are formed on the first main surface side of the semiconductor substrate 100 by a general method and a drain region or a drain electrode is formed on the second main surface side of the semiconductor substrate 100. In this way, the semiconductor device illustrated in FIG. 4 is completed.

The first semiconductor layer 15 below the anode metal wiring line 6 and the second semiconductor layer 16 below the cathode metal wiring line 7 are formed at the same time as the temperature detecting diode 1. Therefore, the first insulating film 12, the conductive layer 14, and the second insulating film 13 below the anode metal wiring line 6 and the cathode metal wiring line 7 are each formed at the same time as the first insulating film 12, the conductive layer 14, and the second insulating film 13 in the step of forming the temperature detecting diode 1. The semiconductor layer which is made of undoped polysilicon for forming the first semiconductor layer 15 and the second semiconductor layer 16 is formed at the same time as the semiconductor layer which is made of undoped polysilicon for forming the temperature detecting diode 1.

As described above, according to Embodiment 13, the first insulating film 12 is used as the gate insulating film 32 and polysilicon for forming the gate electrode 33 is used as the conductive layer 14. Therefore, it is possible to reduce the number of production steps.

When the method for producing the semiconductor device according to Embodiment 13 is applied to Embodiments 8 to 11, the step of forming the conductive layer 14 and the second insulating film 13 may be omitted. In this case, a capacitive component region is formed between the temperature detecting diode 1 and the semiconductor substrate 100, between the protective diodes 21 and 22 and the semiconductor substrate 100, between the semiconductor substrate 100 and the first semiconductor layer 15 below the anode metal wiring line 6, or between the semiconductor substrate 100 and the second semiconductor layer 16 below the cathode metal wiring line 7.

When the method for producing the semiconductor device according to Embodiment 13 is applied to Embodiments 1 to 7, a capacitive component region is formed between the temperature detecting diode 1 and the conductive layer 14, between the protective diodes 21 and 22 and the conductive layer 14, between the conductive layer 14 and the first semiconductor layer 15 below the anode metal wiring line 6, and between the conductive layer 14 and the second semiconductor layer 16 below the cathode metal wiring line 7. In addition, a capacitive component region can be formed between the conductive layer 14 and the semiconductor substrate 100. Therefore, it is possible to improve the static electricity resistance of the temperature detecting diode 1 and the protective diodes 21 and 22, as compared to Embodiments 8 to 11. In addition, since the conductive layer 14 is electrically insulated from the gate electrode 33, the source electrode 34, the drain electrode 35, the anode electrode, and the cathode electrode, it is possible to prevent the adverse effect of a surge voltage applied to each electrode.

The invention is not limited to the above-described embodiments, but various modifications and changes of the invention can be made without departing from the scope and spirit of the invention. In addition, in each embodiment, the first conductivity type is an n type and the second conductivity type is a p type. However, the invention is not limited thereto. The first conductivity type may be a p type and the second conductivity type may be an n type. In this case, the same effect as described above is obtained.

INDUSTRIAL APPLICABILITY

As described above, the semiconductor devices and the semiconductor devices production methods according to the invention are useful for MOS semiconductor elements including a temperature detecting diode or a protective diode.

EXPLANATIONS OF LETTERS OR NUMERALS

1 TEMPERATURE DETECTING DIODE
2 PROTECTIVE DIODE
3 ANODE ELECTRODE PAD
4 CATHODE ELECTRODE PAD
5 GATE ELECTRODE PAD
6 ANODE METAL WIRING LINE
7 CATHODE METAL WIRING LINE
8 ACTIVE REGION
9 FIRST SEMICONDUCTOR LAYER
10 FIRST SEMICONDUCTOR REGION
11 SECOND SEMICONDUCTOR REGION (SOURCE REGION)
12 FIRST INSULATING FILM
13 SECOND INSULATING FILM
14, 14a, 14b CONDUCTIVE LAYER
15 FIRST SEMICONDUCTOR LAYER
16 SECOND SEMICONDUCTOR LAYER
17 INTERLAYER INSULATING FILM
18 SEMICONDUCTOR LAYER
19 INSULATING FILM
21 PROTECTIVE DIODE BETWEEN GATE AND SOURCE
22 PROTECTIVE DIODE BETWEEN GATE AND DRAIN
31 TRENCH
32 GATE INSULATING FILM
33 GATE ELECTRODE
34 SOURCE ELECTRODE
35 DRAIN ELECTRODE
36 DRAIN REGION
37 DRAIN ELECTRODE (SECOND MAIN SURFACE)
38 DRAIN REGION (SECOND MAIN SURFACE)
51 MOSFET
100 SEMICONDUCTOR SUBSTRATE
111 $p^+$ LAYER
112 $n^+$ LAYER
G GATE
S SOURCE
D DRAIN
A ANODE
K CATHODE
C1, C1a, C1b, C1c, C1d, C1e, C2, C2a, C2b, C2c, C2d, C2e, C2f, C2g, C2h, C2i, C2j, C3, C3a, C3b, C4, C5, C6, C7, C7a, C7b, C7c, C7d, C7e, C8, C9, C9a, C9b, C9c, C9d, C9e, C10, C11, C12, C13, C14, C41, C41a, C41b, C41c, C41d, C41e, C41f, C41g, C41h, C41i, C41j, C42, C43, C44, C44a, C44b, C44c, C44d, C44e, C45, C45a, C45b, C45c, C45d, C45e, C46 CAPACITOR

What is claimed is:
1. A semiconductor device, comprising:
an insulated gate semiconductor element that makes a current flow in a thickness direction of a semiconductor substrate;
a temperature detecting diode that detects a temperature of the insulated gate semiconductor element and is provided in an active region of the insulated gate semiconductor element;
an anode metal wiring line that is provided on a first main surface side of the semiconductor substrate and is connected to an anode of the temperature detecting diode;
a cathode metal wiring line that is provided on the first main surface side of the semiconductor substrate and is connected to a cathode of the temperature detecting diode, the anode metal wiring line and the cathode metal wiring line each being not connected to the insulated gate semiconductor element;
a first semiconductor region of a second conductivity type, formed on the semiconductor substrate;
a first insulating film that is formed on the first semiconductor region between the anode and cathode metal wiring lines and the semiconductor substrate;
a first semiconductor layer that is formed directly between the first insulating film and the anode metal wiring line and spaced apart from the temperature detecting diode, and is connected to the anode metal wiring line;
a second semiconductor layer that is formed directly between the first insulating film and the cathode metal wiring line and spaced apart from the temperature detecting diode, and is connected to the cathode metal wiring line;
a first capacitor that has the first insulating film, as a first capacitive component region, between the first semiconductor layer and the semiconductor substrate;
a second capacitor that has the first insulating film, as a second capacitive component region, between the second semiconductor layer and the semiconductor substrate; and an interlayer insulating film disposed directly on the first semiconductor region in a gap in the first insulating film.
2. The semiconductor device according to claim 1, wherein the insulated gate semiconductor element includes:
another semiconductor layer of a first conductivity type that is formed in a surface layer of a first main surface of the semiconductor substrate, the first semiconductor region of the second conductivity type being selectively formed in a surface layer of the another semiconductor layer which is close to the first main surface;
a second semiconductor region of the first conductivity type that is selectively formed in a surface layer of the first semiconductor region; and
a gate electrode that is formed on a surface of the first semiconductor region, with a gate insulating film interposed therebetween, in a portion which is interposed between the another semiconductor layer and the second semiconductor region.
3. The semiconductor device according to claim 1, wherein the insulated gate semiconductor element includes:
a third semiconductor layer of a first conductivity type that is formed in a surface layer of the first main surface of the semiconductor substrate, the first semiconductor region of the second conductivity type being selectively formed in a surface layer of the third semiconductor layer which is close to the first main surface;

a second semiconductor region of the first conductivity type that is selectively formed in a surface layer of the first semiconductor region which is close to the first main surface; and a gate electrode that is formed on a surface of the first semiconductor region, with a gate insulating film interposed therebetween, in a portion which is interposed between the third semiconductor layer and the second semiconductor region.

4. The semiconductor device according to claim 2, further comprising:

a gate electrode pad that is connected to the gate electrode; and a source electrode that is connected to the first semiconductor region and the second semiconductor region; and a protective diode that is formed between the gate electrode pad and the source electrode.

5. The semiconductor device according to claim 2, further comprising:

a gate electrode pad that is connected to the gate electrode;

a third semiconductor region of the first conductivity type that is selectively formed in the surface layer of the another semiconductor layer, the third semiconductor region being close to the first main surface of the semiconductor substrate;

a drain electrode that is connected to the third semiconductor region; and a protective diode that is formed between the gate electrode pad and the drain electrode.

6. The semiconductor device according to claim 1, wherein the insulated gate semiconductor element is a trench-type insulated gate semiconductor element.

7. The semiconductor device according to claim 1, wherein the first insulating film has a thickness that is equal to or greater than a thickness of a gate insulating film of the insulated gate semiconductor element, and is equal to or less than 1000 Å.

8. The semiconductor device according to claim 1, wherein the interlayer insulating film is disposed between the insulated gate semiconductor element, and the anode metal wiring line and the cathode metal wiring lines, to insulate the temperature detecting diode from the insulated gate semiconductor element.

* * * * *